United States Patent
Shiozawa et al.

(10) Patent No.: US 6,245,641 B1
(45) Date of Patent: Jun. 12, 2001

(54) SEMICONDUCTOR DEVICE COMPRISING TRENCH ISOLATION INSULATOR FILM AND METHOD OF FABRICATING THE SAME

(75) Inventors: Katsuomi Shiozawa; Toshiyuki Oishi, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/116,885

(22) Filed: Jul. 16, 1998

(30) Foreign Application Priority Data

Jan. 30, 1998 (JP) .................................. 10-019361

(51) Int. Cl.⁷ .................................................. H04L 21/76
(52) U.S. Cl. ........................... 438/427; 438/435; 438/437
(58) Field of Search .................................. 438/424, 435, 438/427, 437

(56) References Cited

U.S. PATENT DOCUMENTS 5,498,565 * 3/1996 Gocho et al. ................. 148/DIG. 50
5,915,190 * 6/1999 Pirkle ................................... 438/424
5,981,355 * 11/1999 Lee ....................................... 438/424
6,033,970 * 3/2000 Park ..................................... 438/435

OTHER PUBLICATIONS

"HDP–CVD: Trying to Lasso Lightning", Ed Korczynski. Solid State Technology, Apr. 1996, pp. 63–73.

* cited by examiner

Primary Examiner—Trung Dang
(74) Attorney, Agent, or Firm—McDermott, Will & Emery

(57) ABSTRACT

A first trench having a first width and a second trench having a width which is smaller than the first width are formed on a major surface of a semiconductor substrate. A first isolation insulator having an outer side wall is formed to fill up the first trench. A second isolation insulator having an outer side wall is formed to fill up the second trench. The first isolation insulator includes a side wall insulator film forming the outer side wall and an internal insulator film enclosed with the side wall insulator film for filling up the first trench. The second isolation insulator includes an internal insulator film forming the outer side wall for filling up the second trench. Thus obtained are a highly reliable semiconductor device comprising isolation insulators having different widths and a method of fabricating the same.

9 Claims, 19 Drawing Sheets

SEMICONDUCTOR DEVICE COMPRISING TRENCH ISOLATION INSULATOR FILM AND METHOD OF FABRICATING THE SAME

BACKGROUND OF THE INVENTION

1. Field of the Invention

The present invention relates to a semiconductor device and a method of fabricating the same, and more specifically, it relates to a semiconductor device comprising trench isolation insulator films and a method of fabricating the same.

2. Description of the Prior Art

Following refinement and high integration of a semiconductor device, trench isolation oxide films are generally employed for electrically isolating elements which are formed on a major surface of a semiconductor substrate from each other. FIG. 26 is a sectional view for illustrating conventional trench isolation oxide films. With reference to FIG. 26, the conventional trench isolation oxide films are now described.

Referring to FIG. 26, trenches 104a to 104c are formed on a major surface of a semiconductor substrate 101. Thermal oxide films 105a to 105c are formed on surface portions of the semiconductor substrate 101 located in the trenches 104a to 104c respectively. Oxide films 113a to 113c serving as isolation insulator films are formed in the trenches 104a to 104c by chemical vapor deposition (hereinafter referred to as CVD) respectively. The widths W1 of the oxide films 113a to 113c and the intervals therebetween (the widths of element forming regions on the major surface of the semiconductor substrate 101) are set at various values in a single semiconductor device.

FIGS. 27 to 30 are sectional views for illustrating steps of forming the conventional trench isolation oxide films 113a to 113c shown in FIG. 26. With reference to FIGS. 27 to 30, the steps of forming the conventional trench isolation oxide films 113a to 113c are now described.

First, a thermal oxide film (not shown) is formed on the major surface of the semiconductor substrate 101 (see FIG. 27). A silicon nitride film (not shown) is formed on this thermal oxide film. A resist pattern (not shown) is formed on this silicon nitride film and thereafter employed as a mask for partially removing the silicon nitride film and the thermal oxide film by anisotropic etching. Thereafter the resist pattern is removed. Thus, thermal oxide films 102a to 102d and silicon nitride films 103a to 103d are formed on the major surface of the semiconductor substrate 101, as shown in FIG. 27.

Then, the silicon nitride films 103a to 103d are employed as masks for partially removing the semiconductor substrate 101 by anisotropic etching, thereby forming the trenches 104a to 104c as shown in FIG. 28. These trenches 104a to 104c are set at a depth capable of electrically isolating elements in the element forming regions from each other. For example, it is inferred that the depth of such trenches is not more than about 0.35 $\mu$m in a DRAM (dynamic random access memory) having a storage capacity of at least 1 gigabyte (G).

After formation of the trenches 104a to 104c, the surface portions of the semiconductor substrate 101 located in the trenches 104a to 104c may have defects resulting from the aforementioned anisotropic etching. In order to remove such defects, the surface portions of the semiconductor substrate 101 located in the trenches 104a to 104c may be thermally oxidized and thereafter partially removed with an HF solution. Alternatively, the surface portions of the semiconductor substrate 101 located in the trenches 104a to 104c may be removed by isotropic etching, or the semiconductor substrate 101 may be heat-treated, in order to remove the aforementioned defects.

Then, the surface portions of the semiconductor substrate 101 located in the trenches 104a to 104c are thermally oxidized, thereby forming the thermal oxide films 105a to 105c, as shown in FIG. 29. Then, an oxide film 113 is deposited on the silicon nitride films 103a to 103d and in the trenches 104a to 104c by CVD.

Then, the oxide film 113 is partially removed by anisotropic etching, thereby obtaining a structure shown in FIG. 30.

Then, the silicon nitride films 103a to 103d and the thermal oxide films 102a to 102d are removed from the major surface of the semiconductor substrate 101 by etching, thereby obtaining the structure shown in FIG. 26. The conventional trench isolation oxide films 113a to 113c are formed in this method.

Higher integration and refinement are increasingly required to semiconductor devices in recent years, particularly in semiconductor memory devices such as DRAMs. Therefore, the widths W1 of the trench isolation oxide films 113a, 113b and 113c shown in FIG. 26 must be further reduced. For example, it is predicted that the widths W1 of such trench isolation oxide films 113a, 113b and 113c are about 0.1 to 0.2 $\mu$m in a 1-gigabyte DRAM.

When the widths W1 of the trench isolation oxide films 113a, 113b and 113c are reduced, however, a part of the oxide film 113 formed in the trench 104c and on the silicon nitride films 103c and 103d by CVD may come into contact with an upper portion of the trench 104c to close its opening and define a void 114 in the trench 104c before filling up the same, as shown in FIG. 31. Such a void 114 formed in the trench isolation oxide film 104c deteriorates the isolation property thereof, leading to insufficient electric isolation between the elements formed on the surface of the semiconductor substrate 101. This results in a problem such as a malfunction of the semiconductor device.

In order to fill up narrow trenches with an oxide film while forming no void, proposed is a method of forming trench isolation oxide films through deposition such as HDP-CVD (high density plasma CVD) simultaneously progressing deposition and etching of an oxide film. FIG. 32 is a sectional view showing trench isolation oxide films formed by HDP-CVD. Referring to FIG. 32, trenches 124a to 124c are formed on a major surface of a semiconductor substrate 101. Thermal oxide films 105a to 105c are formed on surface portions of the semiconductor substrate 101 located in the trenches 124a to 124c respectively. Silicon oxide films 115a to 115c are formed by HDP-CVD, to fill up the trenches 124a to 124c respectively. The width W2 of the trenches 124a to 124c is set at 0.25 $\mu$m, and the interval W3 between the trenches 124a to 124c is set at 0.55 $\mu$m.

FIG. 33 is a sectional view for illustrating a method of forming the trench isolation oxide films shown in FIG. 32 by HDP-CVD. With reference to FIG. 33, the method of forming the trench isolation oxide films by HDP-CVD is now described.

First, thermal oxide films 102a to 102d (see FIG. 33) and silicon nitride films 103a to 103d (see FIG. 33) are formed on the major surface of the semiconductor substrate 101 (see FIG. 33), and the trenches 124a to 124c are formed on the semiconductor substrate 101, through steps similar to those shown in FIGS. 27 and 28.

Then, the thermal oxide films 105a to 105c (see FIG. 33) are formed on the surface portions of the semiconductor substrate 101 located in the trenches 124a to 124c respectively. Then, a silicon oxide film 115 is formed in the trenches 124a to 124c and on the silicon nitride films 103a to 103d by HDP-CVD, as shown in FIG. 33.

At this time, the silicon oxide film 115 is deposited in the trenches 124a to 124c and simultaneously partially sputter-etched on upper portions of the trenches 124a to 124c. Therefore, the parts of the silicon oxide film 115 do not come into contact with the upper portions of the trenches 124a to 124c to close the openings thereof, dissimilarly to the general step of forming the silicon oxide film by the CVD. Parts of the silicon oxide film 115 deposited on the silicon nitride films 103a to 103d are formed to have side surfaces inclined at an angle of about 45°, since corner portions of the silicon oxide film 115 are sputter-etched on the upper portions of the trenches 124a to 124c.

Thereafter the parts of the silicon oxide film 115 located on the silicon nitride films 103a to 103d are removed and the silicon nitride films 103a to 103d and the thermal oxide films 102a to 102d are removed from the semiconductor substrate 101 through a step similar to that shown in FIG. 30, thereby obtaining the structure shown in FIG. 32.

Thus, trench isolation oxide films having a narrower width can be formed by HDP-CVD. However, the inventors have further studied and carried out steps of forming a plurality of trench isolation oxide films having different widths and separating from each other at different intervals under conditions closer to those for actual steps of fabricating a semiconductor device, to find out the following subject:

FIGS. 34 to 36 are sectional views for illustrating the steps of forming trench isolation oxide films carried out by the inventors. The steps of forming trench isolation oxide films carried out by the inventors are now described with reference to FIGS. 34 to 36.

First, thermal oxide films 102a to 102d and silicon nitride films 103a to 103d are formed on a major surface of a semiconductor substrate 101 as shown in FIG. 28, through steps similar to those for forming the conventional trench isolation oxide films shown in FIGS. 27 and 28. The silicon nitride films 103a to 103d are employed as masks for partially removing the semiconductor substrate 101 by anisotropic etching, thereby forming trenches 104a to 104c. The widths W6 and W7 (see FIG. 34) of the trenches 104b and 104a are set at 0.2 μm and 2.5 μm respectively.

Then, surface portions of the semiconductor substrate 101 located in the trenches 104a to 104c are thermally oxidized, thereby forming thermal oxide films 105a to 105c (see FIG. 34) respectively. Then, a silicon oxide film 115 (see FIG. 34) is deposited in the trenches 104a to 104c and on the silicon nitride films 103a to 103d by HDP-CVD, thereby obtaining the structure shown in FIG. 34.

As hereinabove described, HDP-CVD is adapted to simultaneously progress deposition and removal of the silicon oxide film 115. In this HDP-CVD, the parts of the silicon oxide film 115 removed by sputter etching are deposited on other regions again, to form the silicon oxide film 115. In this HDP-CVD, the balance between the rates for depositing the oxide film 115 and removing the same by sputter etching can be changed by adjusting the type of gas or the pressure of the atmosphere.

Referring to FIG. 34, consider the case of depositing the silicon oxide film 115 in the trenches 104a and 104b having the different widths W7 and W6 respectively. The portion of the silicon oxide film 115 deposited on an upper portion of a side wall of the trench 104b having the relatively narrow width W6, i.e., a corner portion 119 of the silicon nitride film 103c, is partially removed by sputter etching in HDP-CVD. The part of the silicon oxide film 115 removed by sputter etching is deposited in the vicinity of a corner portion 120 of the opposite silicon nitride film 103b again.

On the other hand, a part of the silicon oxide film 115 similarly removed by sputter etching from an upper portion of a side wall of the trench 104a having the large width W7 may be deposited on an upper portion of an opposite side wall of the trench 104a, while the amount of this deposition is smaller than that in the trench 104b, due to the large width W7 of the trench 104a. Therefore, the conditions for HDP-CVD for filling up the trench 104b having the narrow width W6 must be adjusted to increase the rate for partially removing the silicon oxide film 115 by sputter etching as compared with that for filling up the trench 104a having the large width W7, in order to prevent the silicon oxide film 115 from closing the opening in the upper portion of the trench 104b.

Consequently, the silicon oxide film 115 can fill up the trench 104b having the relatively narrow width W6 while forming no void. However, the oxide film 115 is excessively removed from the upper portion of the side wall of the trench 104a having the large width W6 by sputter etching. Thus, not only parts of the silicon nitride films 103a and 103b and the thermal oxide films 102a and 102b employed as masks but a part of the semiconductor substrate 101 is finally removed from the upper portion of the side wall of the trench 104a by sputter etching, as shown in FIG. 34.

Then, portions of the silicon oxide film 115 located on the silicon nitride films 103a to 103d are removed by etching or chemical mechanical polishing (CMP), as shown in FIG. 35.

Then, the silicon nitride films 103a to 103d and the thermal oxide films 102a to 102d are removed from the semiconductor substrate 101 by etching, thereby obtaining a structure shown in FIG. 36. In the step of depositing the silicon oxide film 115 by HDP-CVD shown in FIG. 34, the silicon nitride films 103a and 103b and the thermal oxide films 102a and 102b employed as masks and the semiconductor substrate 101 are partially removed from the trench 104a having the large width W7. Therefore, a trench isolation oxide film 115a has overhang portions 116a and 116b, as shown in FIG. 36. Consequently, the interval W4 between this isolation oxide film 115a and an isolation oxide film 115b on the major surface of the semiconductor substrate 101 is smaller than the interval W5 therebetween under the major surface of the semiconductor substrate 101.

Due to such overhang portions 116a and 116b of the isolation oxide film 115a, the thickness of a polysilicon film deposited for forming a wire 117 of polysilicon on the isolation oxide film 115a may be irregular in a portion 118 close to the overhang portion 116b, as shown in FIG. 37. In a photolithographic step for forming the wire 117, further, the wire 117 cannot attain a designed shape but may be disconnected or shorted due to the presence of the overhang portions 116a and 116b. Thus, the semiconductor device is disadvantageously reduced in reliability. Further, such a defect results in reduction of the yield of the semiconductor device.

When the silicon oxide film 115 is deposited by HD-CVD, the semiconductor substrate 101 is also partially removed from the upper portion of the side wall of the trench 104a by sputter etching, as shown in FIG. 34. Thus, the semiconductor substrate 101 causes a defect due to such partial removal by sputter etching, to disadvantageously increase leakage currents from element forming regions. Such increase of the leakage currents causes deterioration of the electric characteristics of the semiconductor device, to result in reduction of the reliability of the semiconductor device.

SUMMARY OF THE INVENTION

An object of the present invention is to provide a highly reliable semiconductor device comprising a plurality of isolation insulators having different widths and a method of fabricating the same.

In a semiconductor device according to a first aspect of the present invention, a first trench having a first width and a second trench having a second width which is narrower than the first width are formed on a major surface of a semiconductor substrate. A first isolation insulator having an outer side wall for isolating element forming regions from each other is formed to fill up the first trench. A second isolation insulator having an outer side wall for isolating element forming regions from each other is formed to fill up the second trench. The first isolation insulator includes a side wall insulator film forming the outer side wall and an internal insulator film, enclosed with the side wall insulator film, filling up the first trench. The second isolation insulator includes an internal insulator film forming the outer side wall and filling up the second trench.

The first isolation insulator comprises the side wall insulator film forming the outer side wall. When an upper portion of a side surface of the first trench is partially removed in case of forming the internal insulator film in a step of fabricating the semiconductor device, therefore, the side wall insulator film can be formed to have a thickness exceeding that of the removed part. Thus, the semiconductor substrate or the like can be prevented from being partially removed from the upper portion of the side wall of the first trench. Therefore, it is possible to prevent generation of a leakage current from any element forming region of the semiconductor substrate resulting from partial removal of the semiconductor substrate from the upper portion of the side wall of the first trench. Consequently, a semiconductor device having high reliability can be obtained.

Further, it is possible to prevent partial removal of the upper portion of the side wall of the first trench, thereby preventing formation of an overhang portion on an upper portion of the first isolation insulator. In case of forming a wire on the first isolation insulator, therefore, it is possible to prevent such a problem that the wire cannot attain a designed pattern but is disconnected or shorted in photolithography therefor. Consequently, a semiconductor device having high reliability can be obtained.

In the semiconductor device according to the first aspect of the present invention, the side wall insulator film may be made of a material having a thermal expansion coefficient which is substantially identical to that of the semiconductor substrate.

In case of performing heat treatment or the like in a step of fabricating the semiconductor device, therefore, it is possible to prevent generation of stress resulting from difference in thermal expansion between the semiconductor substrate and the side wall insulator film in a contact region therebetween. Thus, the semiconductor substrate can be prevented from a defect caused by such stress. Therefore, generation of a leakage current resulting from such a defect can be prevented in the semiconductor substrate. Consequently, a semiconductor device having high reliability can be obtained.

In the semiconductor device according to the first aspect of the present invention, the side wall insulator film may be a silicon nitride film, and the internal insulator films may be silicon oxide films.

In the semiconductor device according to the first aspect of the present invention, a covering film may be formed on the side wall insulator film.

Thus, a surface portion of the side wall insulator film can be prevented from damage caused by etching or the like in a step of fabricating the semiconductor device and can be prevented from fluctuation of its thickness.

In a method of fabricating a semiconductor device according to a second aspect of the present invention, a covering film is first formed on a major surface of a semiconductor substrate. This covering film is selectively removed, thereby exposing the major surface of the semiconductor substrate in element isolation regions. The semiconductor substrate is partially removed through the covering film serving as a mask, thereby forming a first trench and a second trench having a narrower width than that of the first trench. A side wall insulator film is formed on at least a side surface of the first trench. An insulator film for defining internal insulator films is formed on the side wall insulator film, in the first and second trenches and on the covering film. A part of the insulator film located on the covering film is removed. The covering film is removed.

Thus, the insulator film for defining the internal insulator films is formed on the side wall insulator film, in the first and second trenches and on the covering film. In case of simultaneously removing upper portions of side walls of the trenches in a step of forming the insulator film, therefore, it is possible to prevent partial removal of the covering film and the semiconductor substrate from the upper portions of the side walls of the trenches by forming the side wall insulator film in a thickness exceeding that of the removed parts. In an upper portion of the first trench, therefore, the width of an isolation insulator consisting of the side wall insulator film and the internal insulator film can be prevented from exceeding a designed value to form an overhang portion. In case of forming a wire or the like on the isolation insulator, therefore, it is possible to prevent such a problem that the wire cannot attain a designed pattern but is disconnected or shorted in photolithography therefor. Consequently, a semiconductor device having high reliability can be obtained.

Further, the semiconductor substrate can be prevented from partial removal as described above, whereby no leakage current is generated from any element forming region thereof. Consequently, a semiconductor device having high reliability can be obtained.

Further, the vertical positions of parts of the internal insulator films and the side wall insulator film exposed on the major surface of the semiconductor substrate can be adjusted by adjusting the thickness of the covering film.

In the method of fabricating a semiconductor device according to the second aspect of the present invention, the step of forming the insulator film for defining the internal insulator films on the side wall insulator film, in the first and second trenches and on the covering film may be carried out with a deposition method simultaneously progressing deposition and removal of the insulator film.

Therefore, it is possible to deposit the insulating film in a trench having a narrow width, which is hard to fill up in the conventional CVD, while removing a part of the insulator film deposited on the upper portion of this trench. Therefore, the insulator film can be prevented from closing the upper portion of the trench before filling up the same. Thus, the insulator film can fill up the trench having a narrow width while forming no void. Consequently, it is possible to form an isolation insulator having a narrow width, which is hard to form in the conventional CVD.

In the method of fabricating a semiconductor device according to the second aspect of the present invention, an insulator film for defining the side wall insulator film may be formed in the first and second trenches and on the covering film, and a protective film may be formed on the insulator film in a region located on the first trench, in the step of forming the side wall insulator film on at least the side surface of the first trench. The protective film may be employed as a mask for removing the insulator film from the second trench. Then, the protective film may be removed.

Thus, a surface portion of the insulator film located in the first trench is covered with the protective film, whereby the surface portion of the insulator film located in the first trench can be prevented from damage caused by etching or the like and can be prevented from fluctuation of its thickness when the insulator film is removed from the second trench through the protective film serving as a mask.

The surface portion of the insulator film is not damaged in the first trench, whereby the thickness of the insulator film may not be increased beyond a value necessary for preventing removal of the covering film or the semiconductor substrate on the upper portion of the side wall of the first trench.

In the method of fabricating a semiconductor device according to the second aspect of the present invention, the protective film may be prepared from a resist.

Thus, the fabrication step can be simplified as compared with the case of forming the protective film by a silicon nitride film or the like. In case of employing a silicon nitride film as the protective film, a resist pattern must be formed on the silicon nitride film in a region located on the first trench after forming the silicon nitride film on the insulator film, for removing a part of the silicon nitride film located on the second trench or the like by etching through the resist pattern serving as a mask. When the protective film is prepared from a resist, however, no step is required for partially removing the aforementioned silicon nitride film by etching.

In the method of fabricating a semiconductor device according to the second aspect of the present invention, an insulator film for defining the side wall insulator film may be formed in the first and second trenches and on the covering film so that the thickness of the portion located in the first trench is larger than half the width of the second trench and a first part of the insulator film may be removed by isotropic etching to leave a second part of the insulator film on at least the side surface of the first trench, thereby forming the side wall insulator film in the step of forming the side wall insulator film on at least the side surface of the first trench.

Thus, the side wall insulator film can be formed on at least the side surface of the first trench without forming a protective film on the insulator film in the region located on the first trench. Consequently, the fabrication steps can be simplified.

In the method of fabricating a semiconductor device according to the second aspect of the present invention, the insulator film may be left on the covering film in the step of forming the side wall insulator film by removing the first part of the insulator film by isotropic etching to leave the second part on at least the side surface of the first trench.

Thus, it is possible to increase precisional allowance for a position for stopping the step of removing the insulator film located on the covering film.

In the method of fabricating a semiconductor device according to the second aspect of the present invention, the side wall insulator film may be made of a material having a thermal expansion coefficient which is substantially identical to that of the semiconductor substrate.

Thus, it is possible to prevent generation of stress resulting from difference in thermal expansion between the semiconductor substrate and the side wall insulator film in a contact region therebetween in case of performing heat treatment or the like in any fabrication step for the semiconductor device. Further, the semiconductor substrate can be prevented from a defect caused by such stress. Thus, it is possible to prevent generation of a leakage current resulting from such a defect in the semiconductor device. Consequently, a semiconductor device having high reliability can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(Embodiment 1)

Figure 1:
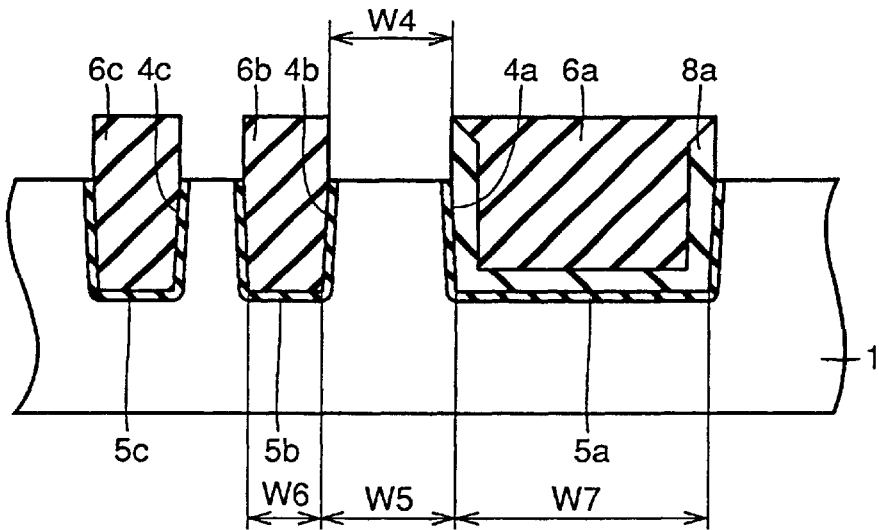
FIG. 1 is a sectional view for illustrating trench isolation oxide films in a semiconductor device according to an embodiment 1 of the present invention.

Referring to FIG. 1, trenches 4a to 4c are formed on a major surface of a semiconductor substrate 1 in a semiconductor device according to an embodiment 1 of the present invention. Thermal oxide films 5a to 5c are formed on surface portions of the semiconductor substrate 1 located in the trenches 4a to 4c respectively. The trenches 4a and 4b have widths W7 and W6 of 2.5 µm and 0.2 µm respectively. A silicon oxide film 8a is formed in the trench 4a by CVD. A silicon oxide film 6a is formed on the silicon oxide film 8a by HDP-CVD. Silicon oxide films 6b and 6c are formed in the trenches 4b and 4c by HDP-CVD respectively. The interval W4 between the silicon oxide films 6b and 8a on the major surface of the semiconductor substrate 1 is substantially identical to the interval W5 between the silicon oxide films 6b and 8a under the major surface of the semiconductor substrate 1, and the trench isolation oxide films 6a to 6c and 8a have no overhang portions.

Thus, the silicon oxide film 8a for serving as a side wall insulator film is formed in the semiconductor device according to the embodiment 1 of the present invention. Even if an upper portion of a side wall of the trench 4a is partially removed when the insulator films 6a to 6c are formed in a step described later, therefore, the semiconductor substrate 1 or the like can be prevented from partial removal from the upper portion of the side wall of the trench 4a if the silicon oxide film 8a is formed to have a thickness exceeding that of the removed part. Thus, it is possible to prevent generation of leakage currents from element forming regions resulting from partial removal of the semiconductor substrate 1.

Further, the trench isolation oxide films 6a to 6c and 8a have no overhang portions. In case of forming wires on the silicon oxide films 6a to 6c and 8a serving as isolation insulators, therefore, it is possible to prevent such a problem that the wires cannot have designed patterns but are disconnected or shorted in photolithography therefor.

With reference to FIGS. 2 to 9, steps of forming the trench isolation oxide films 6a to 6c and 8a in a method of fabricating the semiconductor device according to the embodiment 1 of the present invention are now described.

Figure 2:
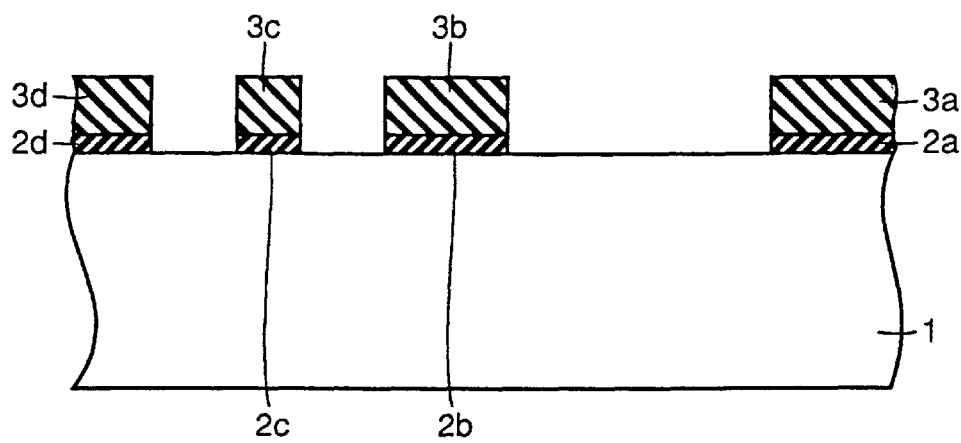
FIGS. 2 to 9 are sectional views for illustrating first to eighth steps of forming the trench isolation oxide films in a method of fabricating the semiconductor device according to the embodiment 1 of the present invention shown in FIG. 1.

First, a thermal oxide film (not shown) is formed on the major surface of the semiconductor substrate 1 (see FIG. 2). A silicon nitride film (not shown) is formed on this thermal oxide film. A resist pattern (not shown) is formed on this silicon nitride film. This resist pattern is employed as a mask for partially removing the silicon nitride film and the thermal oxide film, thereby forming silicon nitride films 3a to 3d (see FIG. 2) and thermal oxide films 2a to 2d (see FIG. 2). Thereafter the resist pattern is removed. Thus, the structure shown in FIG. 2 is obtained.

Figure 3:
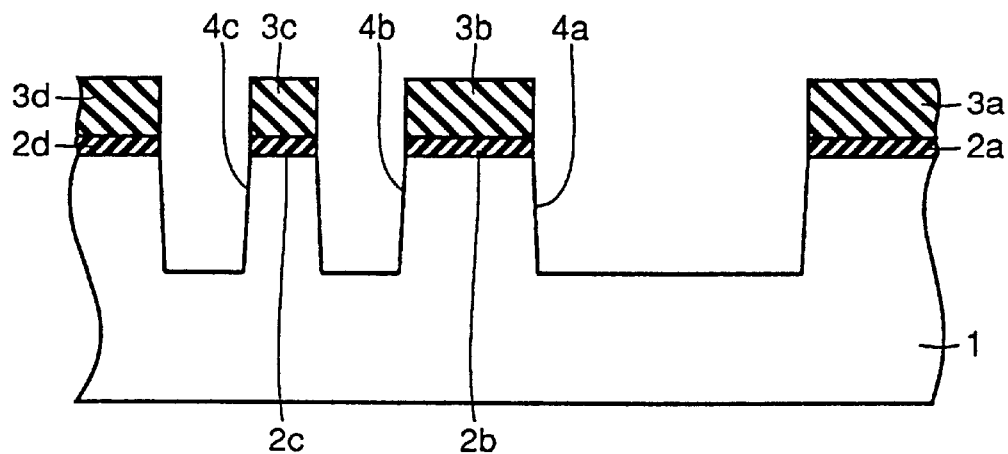

Then, the silicon nitride films 3a to 3d are employed as masks for partially removing the semiconductor substrate 1 by anisotropic etching, thereby forming the trenches 4a to 4c as shown in FIG. 3.

Figure 4:
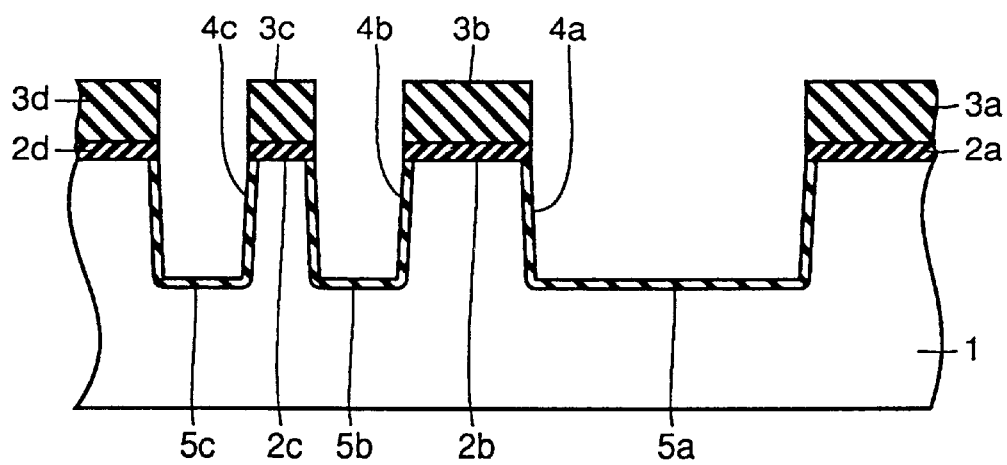

Then, the portions of the major surface of the semiconductor substrate 1 located in the trenches 4a to 4c are thermally oxidized, thereby forming the thermal oxide films 5a to 5c respectively, as shown in FIG. 4.

Figure 5:
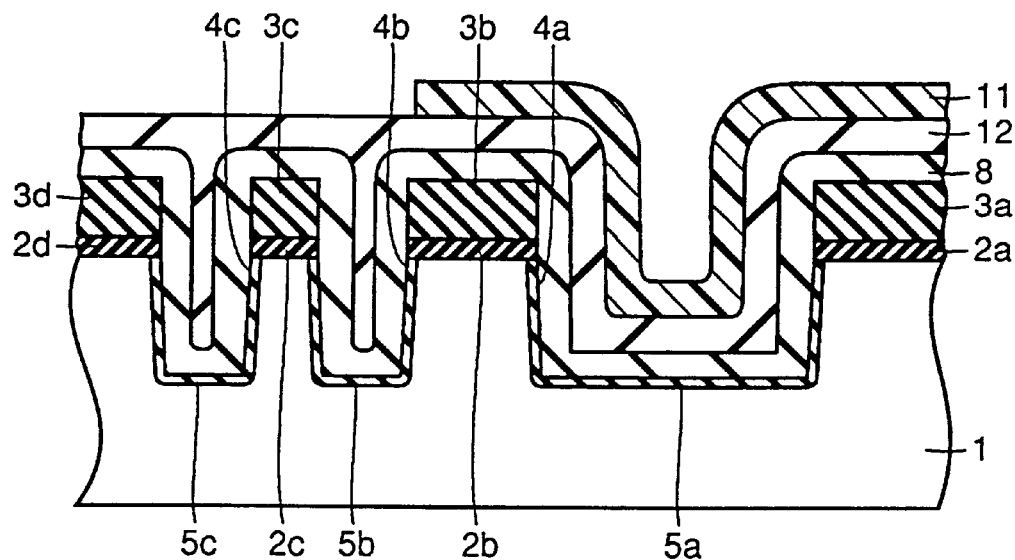

Then, a silicon oxide film 8 (see FIG. 5) is formed in the trenches 4a to 4c and on the silicon nitride films 3a to 3d by CVD. A silicon nitride film 12 (see FIG. 5) is formed on the silicon oxide film 8. A resist pattern 11 (see FIG. 5) is formed on the silicon nitride film 12 in a region located on the trench 4a. Thus, the structure shown in FIG. 5 is obtained.

The silicon nitride film 12 may be replaced with another material such as a polysilicon film, for example, which can be selectively etched with the silicon oxide film 8, to attain a similar effect.

Further, the silicon nitride film 12 can be replaced with a silicon oxide film or a polysilicon film when the silicon oxide film 8 is replaced with a silicon nitride film, while the silicon nitride film 12 can be replaced with a polysilicon film, a silicon oxide film or a silicon nitride film when the silicon oxide film 8 is replaced with an oxi-nitride film. An effect similar to the above can be attained also in this case.

Then, the resist pattern 11 is employed as a mask for removing portions of the silicon nitride film 12 located on the trenches 4b and 4c. Thereafter the resist pattern 11 is removed, thereby obtaining a structure shown in FIG. 6.

Then, the silicon nitride film 12 is employed as a mask for removing portions of the silicon oxide film 8 located in the trenches 4b and 4c and on the silicon nitride films 3c and 3d. Thereafter the silicon nitride film 12 is removed. Thus, a structure shown in FIG. 7 is obtained.

Figure 6:
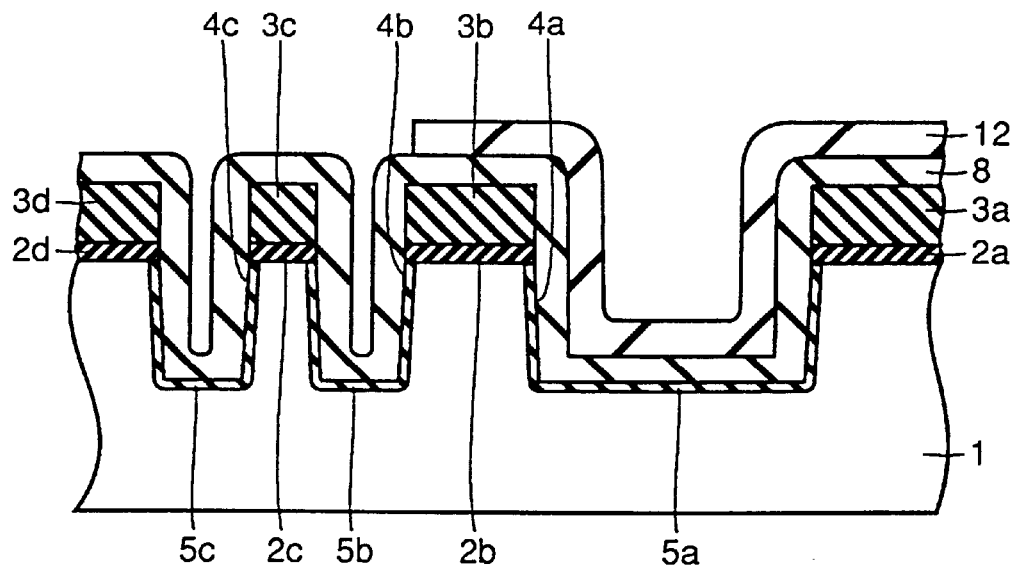
Figure 7:
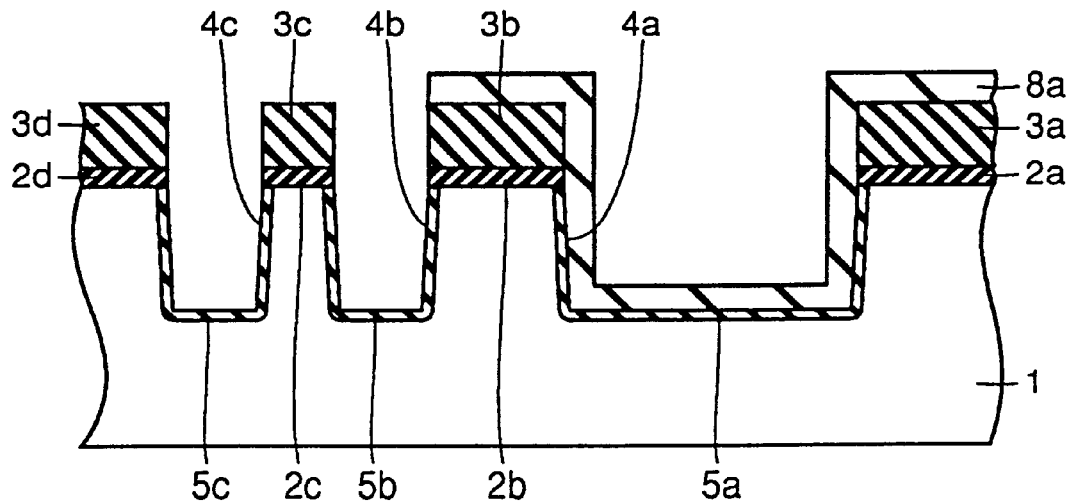

The surface of the silicon oxide film 8a formed in the trench 4a, which is covered with the silicon nitride film 12 (see FIG. 6) serving as a protective film, is not damaged by the etching step shown in FIG. 7, with no fluctuation of the thickness of the silicon oxide film 8a.

Thus, the surface of the silicon oxide film 8a serving as a side wall insulator film is not damaged, with no fluctuation of the thickness. Therefore, the silicon oxide film 8a may be formed to have a thickness necessary for preventing partial removal of the silicon nitride films 3a and 3b and the semiconductor substrate 1 in deposition of a silicon oxide film 6 by HDP-CVD shown in FIG. 8. Thus, the thickness of the silicon oxide film 8a may not be increased beyond necessity.

Figure 8:
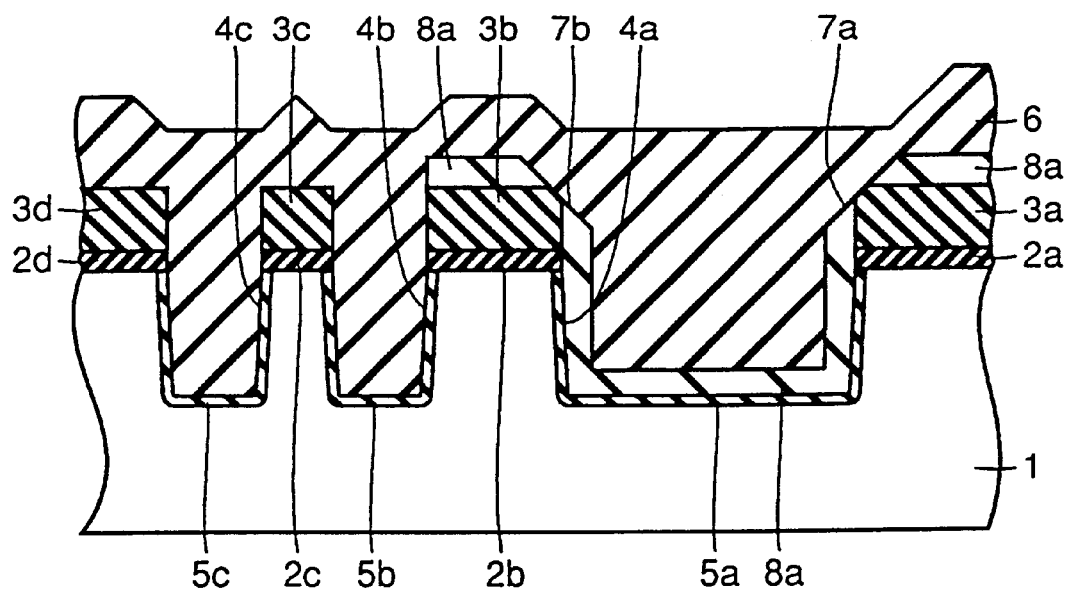

Then, the silicon oxide film 6 is formed in the trenches 4b and 4c and on the silicon nitride films 3c and 3d and the silicon oxide film 8a by HDP-CVD, as shown in FIG. 8. At this time, the ratio of the deposition rate for the silicon oxide film 6 to that for sputter etching in HDP-CVD so that the silicon oxide film 6 can fill up the trench 4b having a narrow width while forming no void, whereby the rate for removing the silicon oxide film 6 or the like by sputter etching is higher than the deposition rate for the silicon oxide film 6 on an upper portion of the trench 4a having a large width. Therefore, the silicon oxide film 8a is partially removed from upper portions of side walls of the trench 4a by this sputter etching, to define inclined surfaces 7a and 7b. However, the silicon nitride films 3a and 3b are hardly removed by this etching.

Thus, when a sufficient thickness is ensured for the silicon oxide film 8a serving as a side wall insulator film, the silicon nitride films 3a and 3b and the semiconductor substrate 1 can be prevented from partial removal from the upper portions of the side walls of the trench 4a in the HDP-CVD step for depositing the silicon oxide film 6. In the trench 4a, therefore, the width W7 (see FIG. 1) of an isolation insulator consisting of the silicon oxide films 8a and 6a (see FIG. 9)

can be prevented from being increased beyond a designed value to form an overhang portion. In case of forming a wire or the like on this isolation insulator, therefore, it is possible to prevent such a problem that the wire cannot attain a designed pattern but is disconnected or shorted in photolithography therefor.

Further, partial removal of the semiconductor substrate 1 can be prevented, thereby preventing generation of leakage currents from the element forming regions of the semiconductor substrate 1.

In addition, it is possible to deposit the silicon oxide film 6, deposited by HDP-CVD, in the trench 4b having a narrow width, which is hard to fill up in the conventional CVD, while removing a part of the insulator film 6 deposited on the upper portion of the trench 4b. Thus, the insulator film 6 can be prevented from closing the upper portion of the trench 4b before filling up the same. Therefore, the insulator film 6 can fill up the trench 4b having a narrow width while forming no void.

Figure 9:
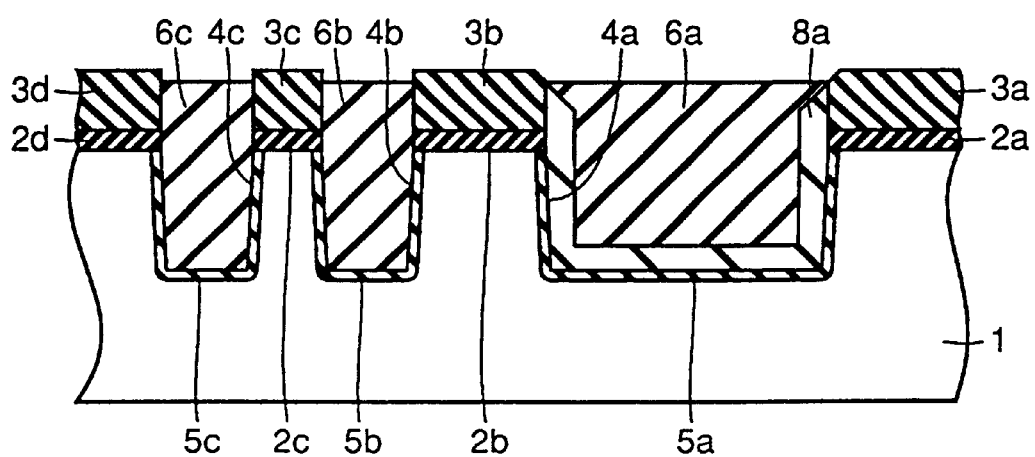

Then, portions of the silicon oxide films 6 and 8a located on the silicon nitride films 3a to 3d are removed by etching or chemical mechanical polishing, as shown in FIG. 9.

The vertical positions of portions of the silicon oxide films 6a to 6c and 8a, serving as isolation oxide films, projecting from the major surface of the semiconductor substrate 1 can be adjusted by adjusting the thickness of the silicon nitride films 3a to 3d.

Then, the silicon nitride films 3a to 3d and the thermal oxide films 2a to 2d are removed by etching, thereby obtaining the structure shown in FIG. 1.

(Embodiment 2)

Figure 10:
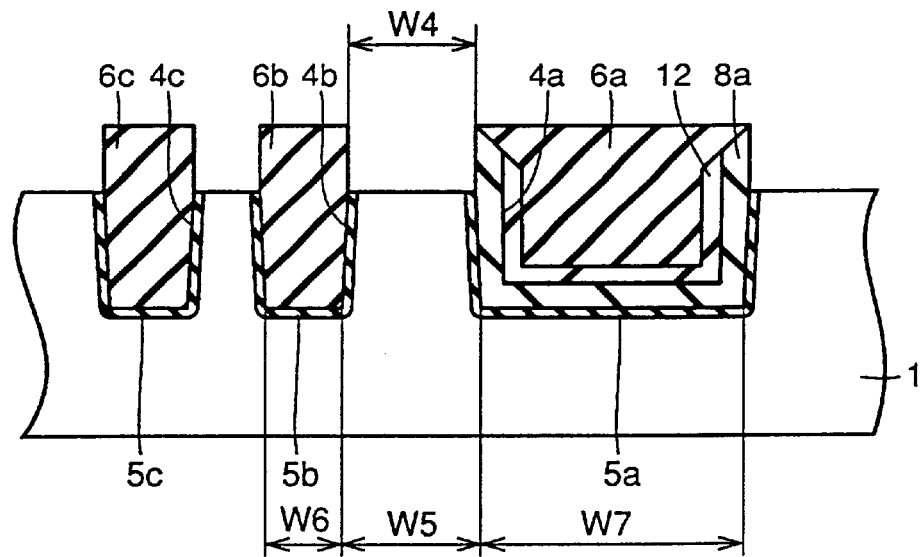
FIG. 10 is a sectional view for illustrating trench isolation oxide films in a semiconductor device according to an embodiment 2 of the present invention.

Referring to FIG. 10, trench isolation oxide films in a semiconductor device according to an embodiment 2 of the present invention are basically similar in structure to those of the semiconductor device according to the embodiment 1 shown in FIG. 1. In a trench 4a, however, a silicon nitride film 12 is formed on a silicon oxide film 8a.

Thus, a step similar to that for removing the silicon nitride film 12 in the embodiment 1 of the present invention shown in FIG. 7 can be omitted, whereby steps of fabricating the semiconductor device according to the embodiment 2 can be simplified.

In order to form the trench isolation oxide films of the semiconductor device according to the embodiment 2 of the present invention shown in FIG. 10, steps similar to those of the embodiment 1 shown in FIGS. 2 to 5 are first carried out. Then, in steps similar to those shown in FIGS. 6 and 7, portions of a silicon oxide film 8 located in trenches 4b and 4c are removed and thereafter a silicon oxide film 6 is deposited by HDP-CVD as shown in FIG. 8, without removing the silicon nitride film 12 (see FIG. 6) employed as a protective film. Thereafter a step similar to that shown in FIG. 9 is carried out, thereby obtaining the structure shown in FIG. 10.

(Embodiment 3)

Figure 11:
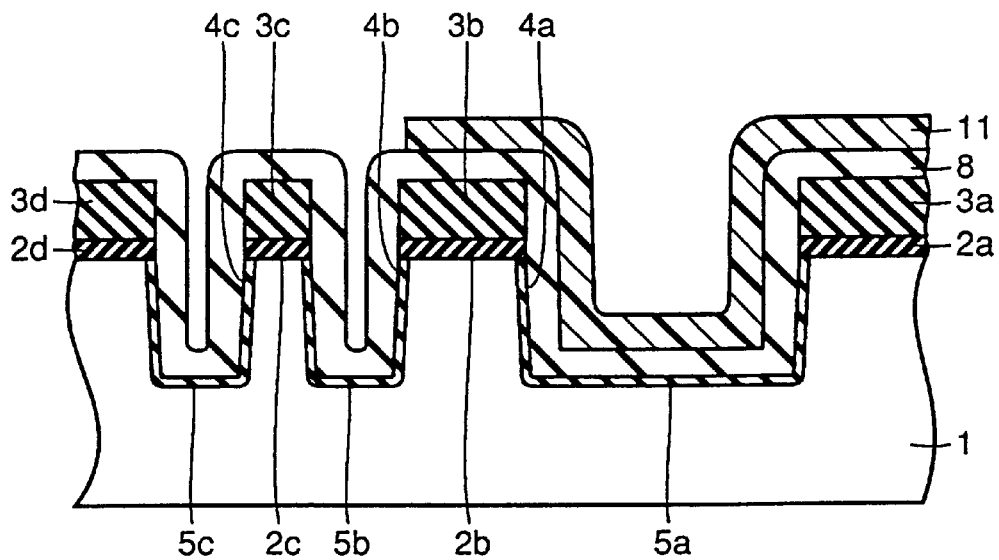
FIG. 11 is a sectional view for illustrating a step of forming trench isolation oxide films in a method of fabricating a semiconductor device according to an embodiment 3 of the present invention.

With reference to FIG. 11, steps of forming trench isolation oxide films in a method of fabricating a semiconductor device according to an embodiment 3 of the present invention are now described.

First, steps similar to those for the semiconductor device according to the embodiment 1 of the present invention shown in FIGS. 2 to 4 are carried out, and thereafter a silicon oxide film 8 (see FIG. 11) is formed in trenches 4a to 4c (see FIG. 11) and on silicon nitride films 3a to 3d (see FIG. 11) by CVD. Then, a resist pattern 11 (see FIG. 11) is formed on the silicon oxide film 8 in a region located on the trench 4a. Thus, the structure shown in FIG. 11 is obtained.

Then, the resist pattern 11 is employed as a mask for partially removing the silicon oxide film 8 from the trenches 4b and 4c, as shown in FIG. 7. Thereafter the resist pattern 11 is removed. Thus, a structure similar to that shown in FIG. 7 is obtained. Then, steps similar to those shown in FIGS. 8 and 9 are carried out, thereby obtaining the trench isolation oxide films similar to those shown in FIG. 1.

The resist pattern 11 is formed on the silicon oxide film 8 for serving as a side wall insulator film and employed as a mask for partially removing the silicon oxide film 8 from the trenches 4b and 4c, whereby the number of the steps can be reduced as compared with the case of forming the silicon nitride film 12 (see FIG. 5) on the silicon oxide film 8 in the steps of the embodiment 1 shown in FIGS. 5 and 6.

(Embodiment 4)

With reference to FIGS. 12 to 15, steps of forming trench isolation oxide films in a method of fabricating a semiconductor device according to an embodiment 4 of the present invention are now described.

Figure 12:
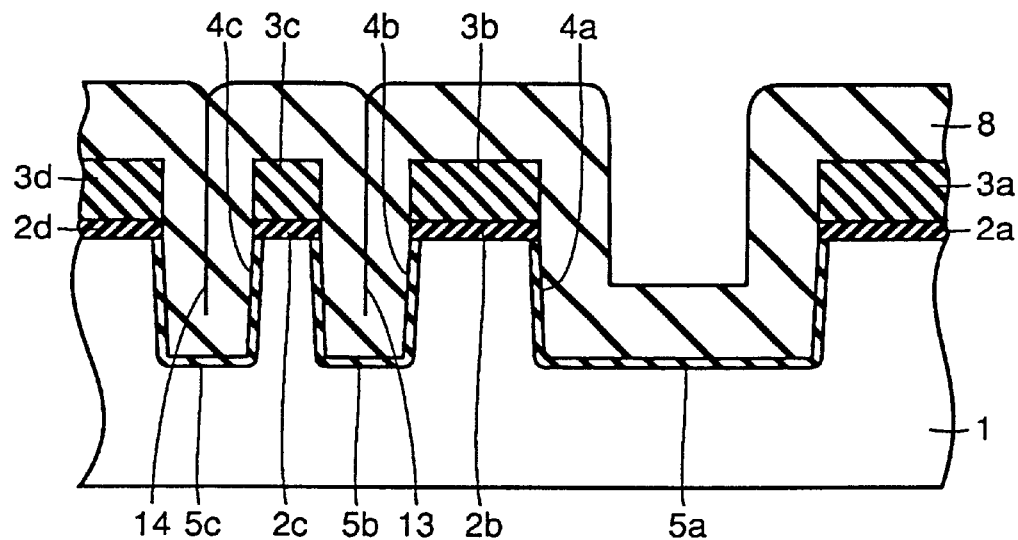
FIGS. 12 to 15 are sectional views for illustrating first to fourth steps of forming trench isolation oxide films in a method of fabricating a semiconductor device according to an embodiment 4 of the present invention.

First, steps similar to those for the trench isolation oxide films in the method of fabricating the semiconductor device according to the embodiment 1 of the present invention shown in FIGS. 2 to 4 are carried out, and thereafter a silicon oxide film 8 is deposited in trenches 4a to 4c and on silicon nitride films 3a to 3d by CVD, as shown in FIG. 12. At this time, the silicon oxide film 8 is deposited in a thickness larger than half the width of the trench 4b. Thus, growing surfaces of parts of the silicon oxide film 8 deposited on opposite side surfaces of the trench 4b come into contact with each other at a substantially central portion of the trench 4b. The contact portion between such growing surfaces of the silicon oxide film 8 is referred to as a seam portion 13. A similar seam portion 14 is defined also in the trench 4c which is substantially identical in width to the trench 4b.

In the trench 4a having a large width, on the other hand, no growing surfaces of the silicon oxide film 8 collide with each other and hence the silicon oxide film 8 can be formed to have a thickness larger than half the width of the trench 4b.

Figure 13:
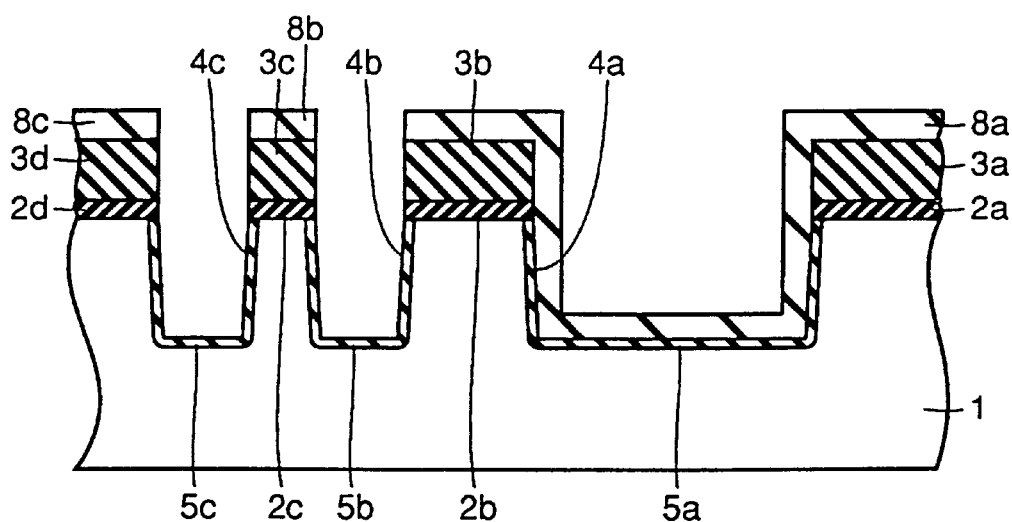

Then, the silicon oxide film 8 is partially removed by wet etching. At this time, an etching solution infiltrates into the trenches 4b and 4c along the seam portions 13 and 14 respectively. The etching rate on the seam portions 13 and 14 is higher than that on the remaining regions of the silicon oxide film 8, due to influence by heterogeneity of crystals or the like. In the trenches 4b and 4c, therefore, the etching progresses from the seam portions 13 and 14. When the wet etching time is so adjusted that the thickness of the removed parts of the silicon oxide film 8 is at least substantially identical to half the width of the trench 4b, it is possible to remove the silicon oxide film 8 (see FIG. 12) from the trenches 4b and 4c having narrow widths while leaving a silicon oxide film 8a in the trench 4a having a large width, as shown in FIG. 13. Further, silicon oxide films 8a to 8c can be left on the silicon nitride films 3a to 3d, since the thickness of the silicon oxide film 8 is larger than half the width of the trench 4b.

When the silicon oxide film 8 is deposited by 0.4 $\mu$m, for example, it is possible to fill up trenches having widths of up to 0.8 $\mu$m. When the silicon oxide film 8 is partially removed by 0.3 $\mu$m by wet etching, a part filling up a trench having a width of up to 0.6 $\mu$m can be removed. In a trench having a width larger than 0.6 $\mu$m, on the other hand, the silicon oxide film 8 is left with a thickness of 0.1 $\mu$m.

Thus, it is possible to form the silicon oxide film 8a for serving as a side wall insulator film in the trench 4a without forming a mask such as the silicon nitride film 12 (see FIG. 6) in the embodiment 1 on the region located on the trench 4a by adjusting the thickness of the silicon oxide film 8 and employing wet etching. Consequently, the steps can be simplified.

Figure 14:
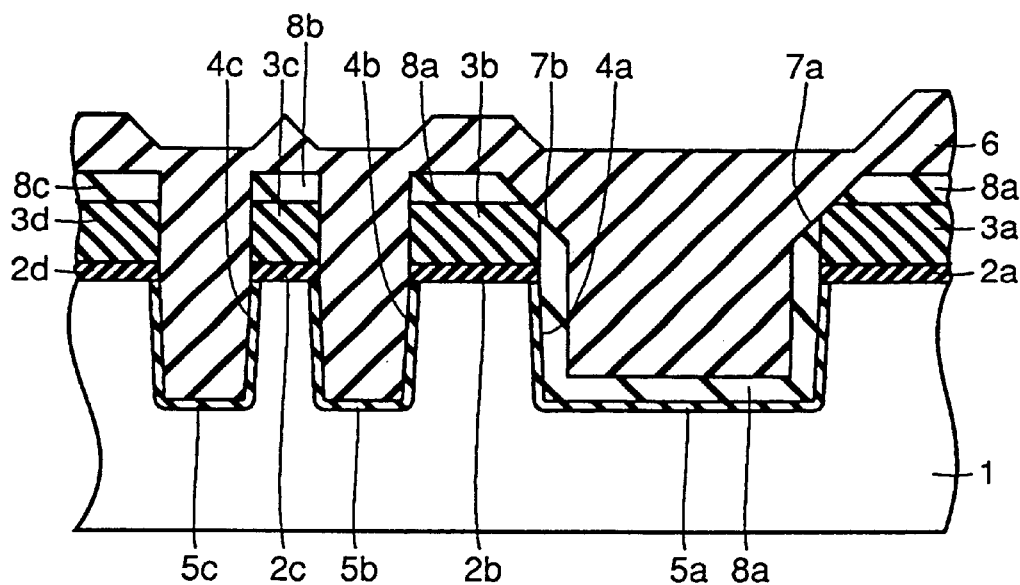

Then, a silicon oxide film 6 is formed in the trenches 4a to 4c and on the silicon oxide films 8a to 8c by HDP-CVD, as shown in FIG. 14. The silicon oxide film 8a serving as a side wall insulator film is formed in the trench 4a having a large width, whereby an effect similar to that of the embodiment 1 shown in FIG. 8 is attained.

Figure 15:
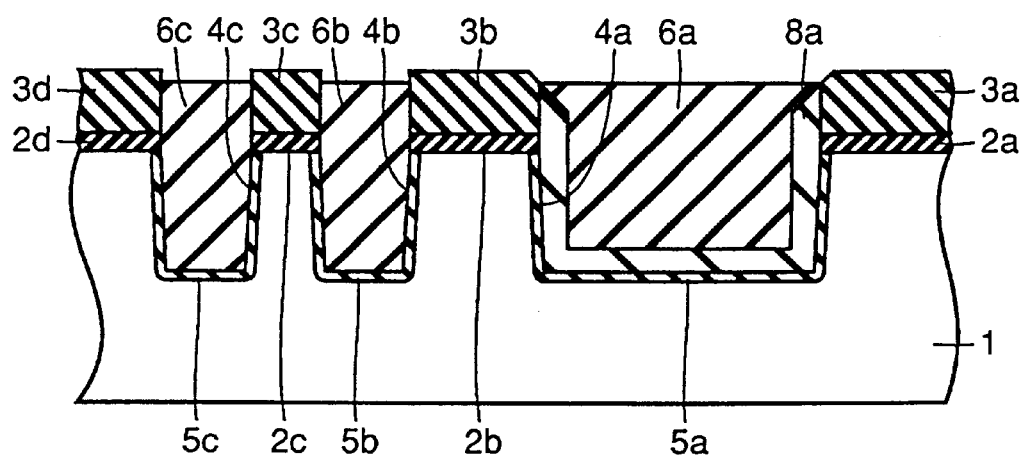

Then, portions of the silicon oxide films 6 and 8a to 8c located on the silicon nitride films 3a to 3d are removed, thereby obtaining a structure shown in FIG. 15.

Due to the formation of the silicon oxide films 8a to 8c (see FIG. 14) on the silicon nitride films 3a to 3d, precisional allowance for a position for stopping etching or chemical mechanical polishing can be increased in the step of removing the portions of the silicon oxide film 6 located on the silicon nitride films 3a to 3d.

Thereafter the silicon nitride films 3a to 3d and the thermal oxide films 2a to 2d are removed from a major surface of a semiconductor substrate 1. Thus, a structure similar to that of the trench isolation oxide films in the semiconductor device according to the embodiment 1 of the present invention shown in FIG. 1 can be obtained.

(Embodiment 5)

Figure 16:
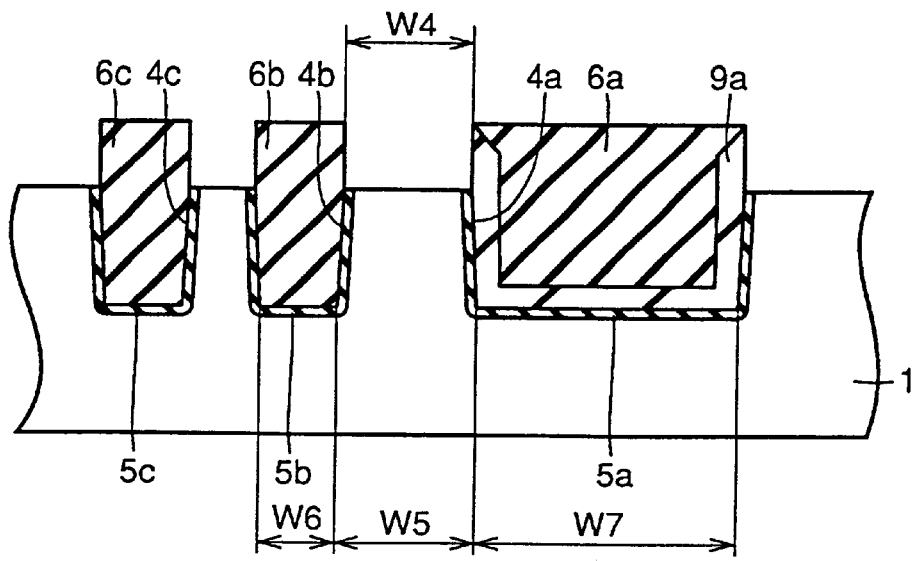
FIG. 16 is a sectional view for illustrating trench isolation oxide films in a semiconductor device according to an embodiment 5 of the present invention.

Referring to FIG. 16, trench isolation oxide films in a semiconductor device according to an embodiment 5 of the present invention are basically similar in structure to those of the semiconductor device according to the embodiment 1 shown in FIG. 1. In the semiconductor device shown in FIG. 16 according to the embodiment 5 of the present invention, however, a silicon nitride film 9a is formed in a trench 4a, as shown in FIG. 16. This silicon nitride film 9a serves as a side wall insulator film similarly to the silicon oxide film 8a shown in FIG. 1, whereby an effect similar to that of the embodiment 1 shown in FIG. 1 can be attained.

With reference to FIGS. 17 to 20, steps of forming the trench isolation oxide films in a method of fabricating the semiconductor device according to the embodiment 5 of the present invention are now described.

Figure 17:
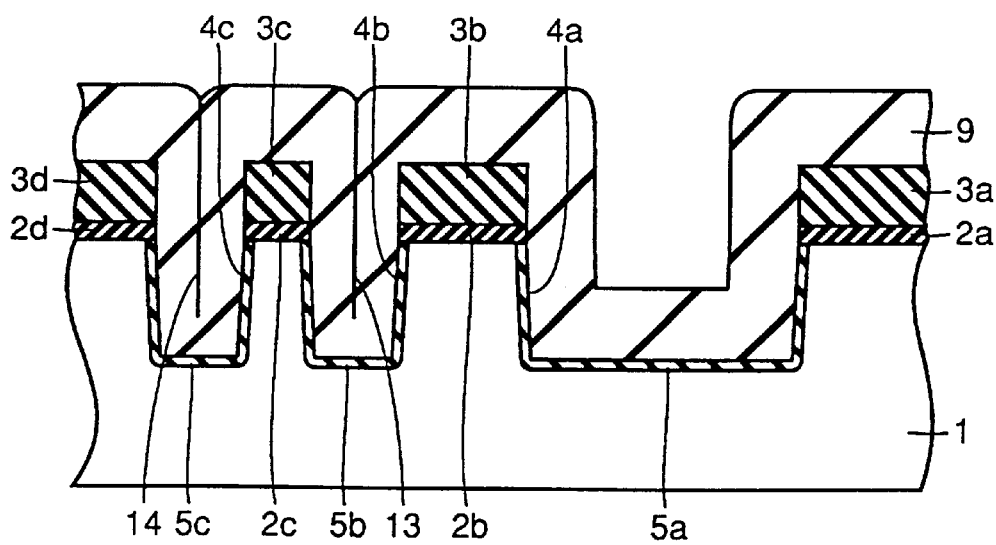
FIGS. 17 to 20 are sectional views for illustrating first to fourth steps of forming the trench isolation oxide films in a method of fabricating the semiconductor device according to the embodiment 5 of the present invention shown in FIG. 16.

First, steps similar to those for forming the trench isolation oxide films in the method of fabricating the semiconductor device according to the embodiment 1 shown in FIGS. 2 to 4 are carried out, and thereafter a silicon nitride film 9 is formed in trenches 4a to 4c and on silicon nitride films 3a to 3d, as shown in FIG. 17. This silicon nitride film 9 is deposited in a thickness larger than half the width of the narrow trench 4b.

Figure 18:
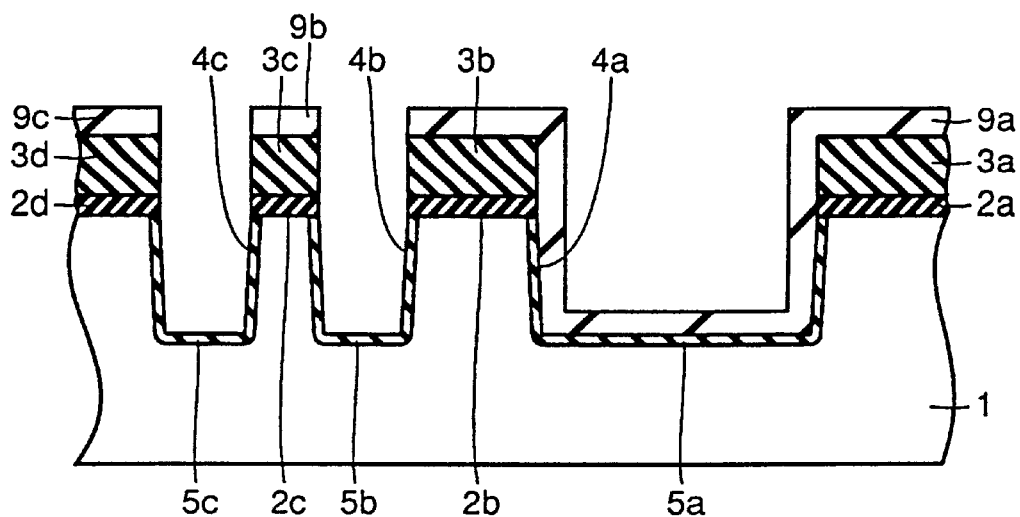

Then, the silicon nitride film 9 is partially removed by wet etching, thereby obtaining a structure shown in FIG. 18. In this wet etching, the silicon nitride film 9 (see FIG. 17) is removed at least in a thickness substantially identical to half the width of the trench 4b, whereby it is possible to leave a silicon nitride film 9a serving as a side wall insulator film in the trench 4a having a large width while simultaneously removing the silicon nitride film 9 (see FIG. 17) from the trenches 4b and 4c having narrow widths, similarly to the steps of forming the trench isolation oxide films in the method of fabricating the semiconductor device according to the embodiment 4 shown in FIGS. 12 and 13. Thus, an effect similar to that in the steps of forming the trench isolation oxide films in the method of fabricating the semiconductor device according to the embodiment 4 shown in FIGS. 12 and 13 can be attained.

Figure 19:
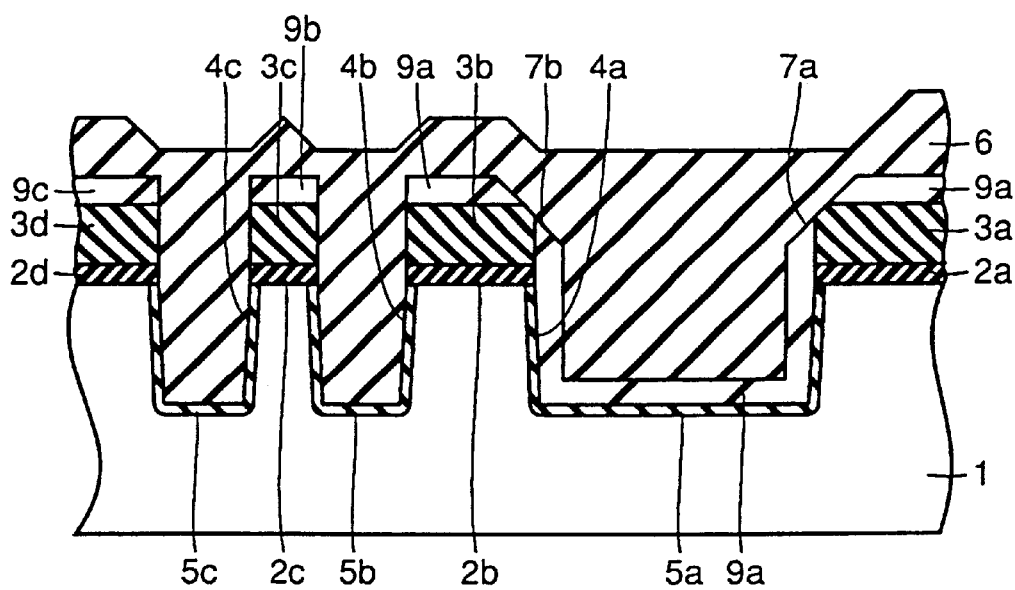

Then, a silicon oxide film 6 is deposited in the trenches 4a to 4c and on the silicon nitride films 9a to 9c by HDP-CVD, as shown in FIG. 19. Due to the silicon nitride film 9a formed in the trench 4a for serving as a side wall insulator film, an effect similar to that in the step of forming the trench isolation oxide films in the method of fabricating the semiconductor device according to the embodiment 1 shown in FIG. 8 can be attained.

Figure 20:
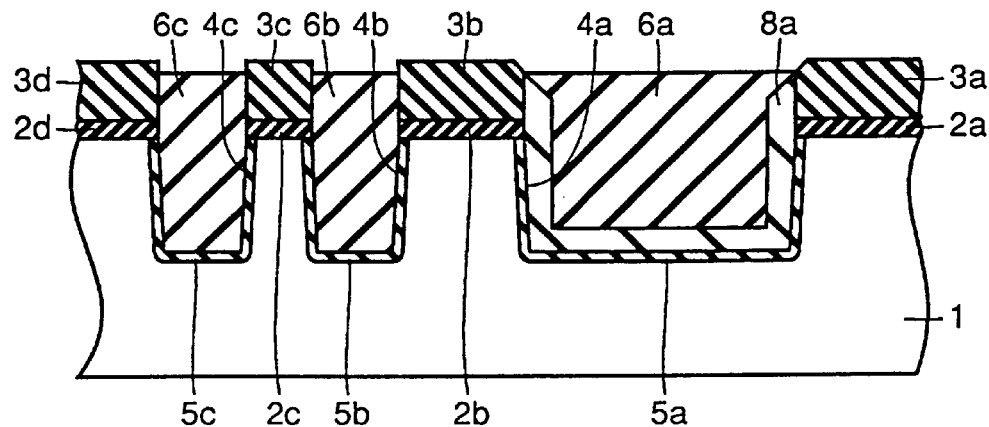

Then, portions of the silicon oxide film 6 located on the silicon nitride films 3a to 3d are removed by etching or chemical mechanical polishing. Thus, a structure shown in FIG. 20 is obtained.

Due to the silicon nitride films 9a to 9c (see FIG. 19) formed on the silicon nitride films 3a to 3d, an effect similar to that in the steps of forming the trench isolation oxide films in the method of fabricating the semiconductor device according to the embodiment 4 shown in FIGS. 14 and 15 can be attained.

Then, the silicon nitride films 3a to 3d and thermal oxide films 2a to 2d are removed from a major surface of a semiconductor substrate 1, thereby obtaining the structure shown in FIG. 16.

(Embodiment 6)

Figure 21:
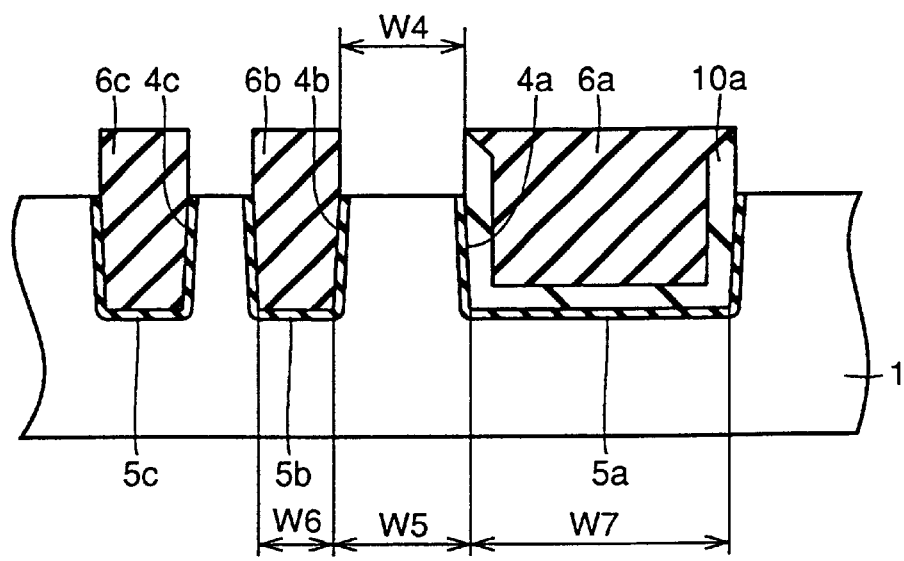
FIG. 21 is a sectional view for illustrating trench isolation oxide films in a semiconductor device according to an embodiment 6 of the present invention.

Referring to FIG. 21, trench isolation oxide films in a semiconductor device according to an embodiment 6 of the present invention are basically similar in structure to those of the semiconductor device according to the embodiment 1 shown in FIG. 1. In the semiconductor device according to the embodiment 6 of the present invention, however, an oxi-nitride film 10a is formed in a trench 4a as a side wall insulator film.

In addition to an effect attained by the structure similar to that of the trench isolation oxide films in the semiconductor device according to the embodiment 1 shown in FIG. 1, therefore, it is possible to provide the oxi-nitride film 10a with a thermal expansion coefficient which is substantially identical to that of a semiconductor substrate 1 by adjusting the composition of the oxi-nitride film 10a. In case of performing heat treatment or the like in any step of fabricating the semiconductor device, therefore, it is possible to prevent generation of stress resulting from difference in thermal expansion between the semiconductor substrate 1 and the oxi-nitride film 10a. Thus, the semiconductor substrate 1 can be prevented from a defect caused by such stress. Thus, the semiconductor device can be prevented from generation of a leakage current resulting from such a defect. Consequently, a semiconductor device having high reliability can be obtained.

With reference to FIGS. 22 to 25, steps of forming the trench isolation oxide films in a method of fabricating the semiconductor device according to the present invention are now described.

Figure 22:
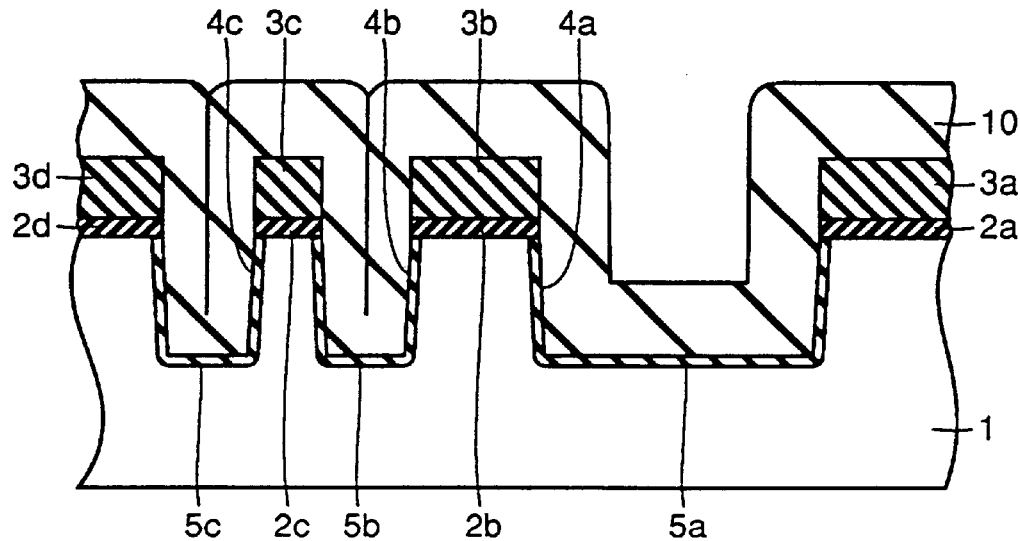
FIGS. 22 to 25 are sectional views for illustrating first to fourth steps of forming the trench isolation oxide films in a method of fabricating the semiconductor device according to the embodiment 6 of the present invention shown in FIG. 21.

First, steps similar to those for forming the trench isolation oxide films in the method of fabricating the semiconductor device according to the embodiment 1 shown in FIGS. 2 to 4 are carried out, and thereafter an oxi-nitride film 10 is formed in trenches 4a to 4c and on silicon nitride films 3a to 3c, as shown in FIG. 22. The oxi-nitride film 10 is so deposited that its thickness is larger than half the width of the narrow trench 4b.

Figure 23:
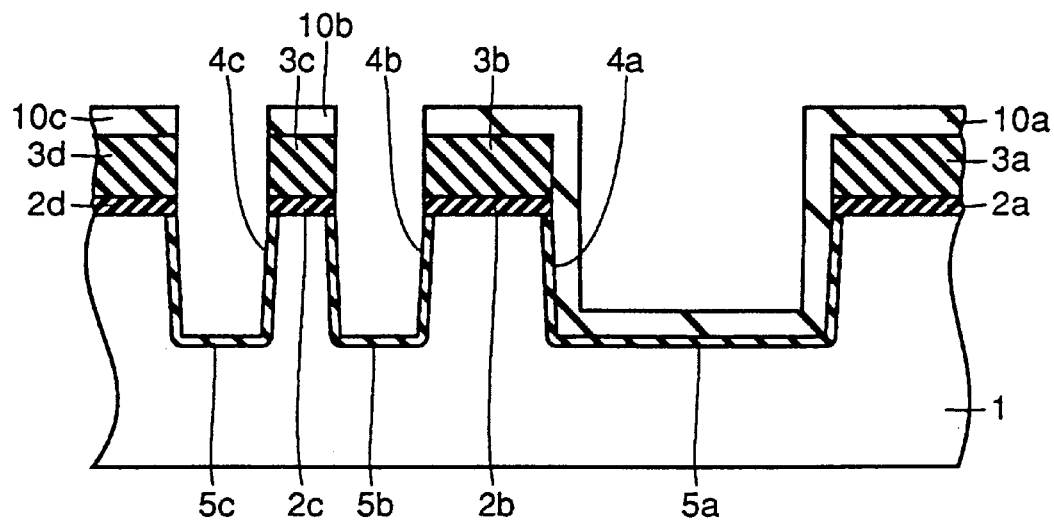

Then, the oxi-nitride film 10 is partially removed by wet etching, thereby obtaining a structure shown in FIG. 23. Similarly to the steps of forming the trench isolation oxide films in the method of fabricating the semiconductor device according to the embodiment 4 of the present invention shown in FIGS. 12 and 13, it is possible to leave the oxi-nitride film 10a for serving as a side wall insulator film in the trench 4a having a large width while simultaneously removing the oxi-nitride film 10 from the trenches 4b and 4c at least in a thickness substantially equal to half the width of the narrow trench 4*b*.

Thus, an effect similar to that in the steps of forming the trench isolation oxide films in the method of fabricating the semiconductor device according to the embodiment 4 shown in FIGS. 12 and 13 can be attained.

Figure 24:
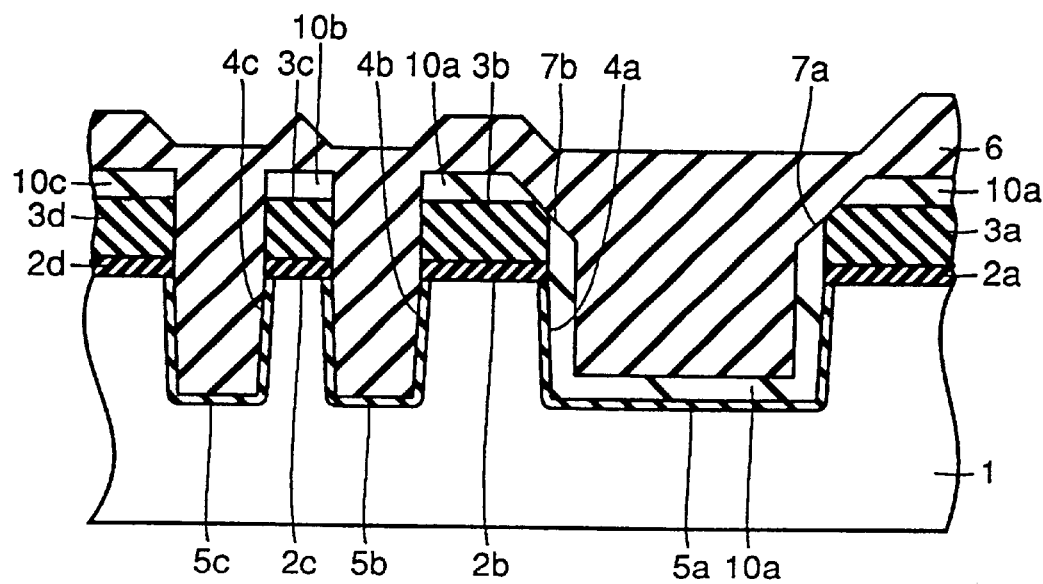

Then, a silicon oxide film 6 is deposited in the trenches 4*a* to 4*c* and on oxi-nitride films 10*a* to 10*c* by HDP-CVD, as shown in FIG. 24.

Due to the oxi-nitride film 10*a* for serving as a side wall insulator film formed in the trench 4*a* having a large width, an effect similar to that in the step of forming the trench isolation oxide films in the method of fabricating the semiconductor device according to the embodiment 1 shown in FIG. 8 can be attained.

Figure 25:
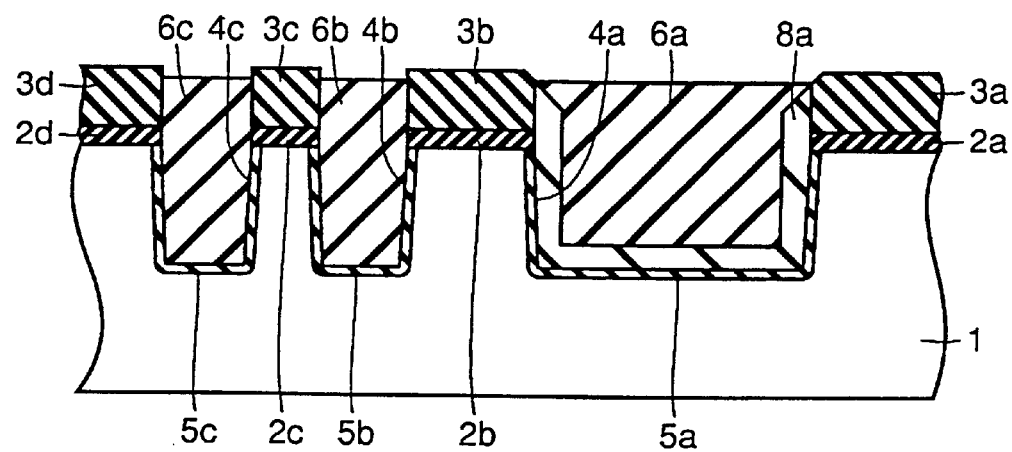
Figure 26:
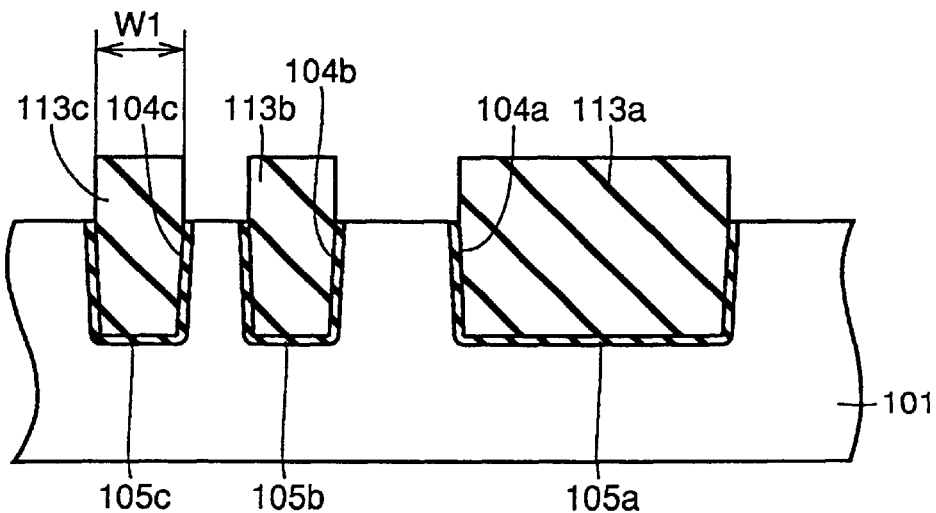
FIG. 26 is a sectional view for illustrating conventional trench isolation oxide films.
Figure 27:
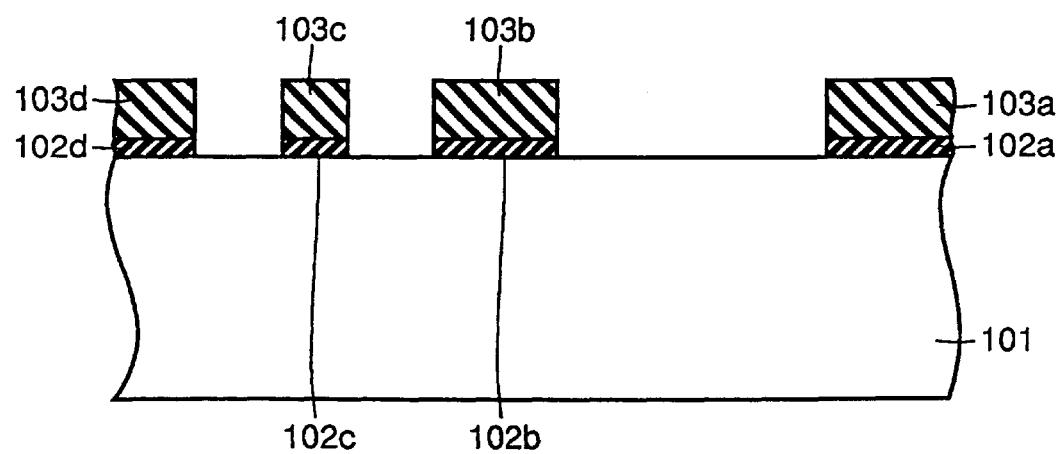
FIGS. 27 to 30 are sectional views for illustrating first to fourth steps of forming the conventional trench isolation oxide films shown in FIG. 26.
Figure 28:
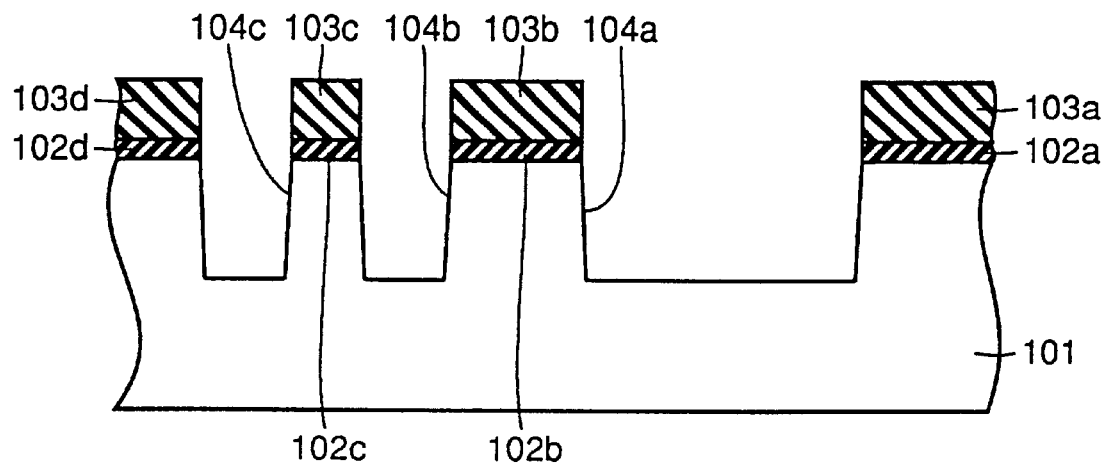
Figure 29:
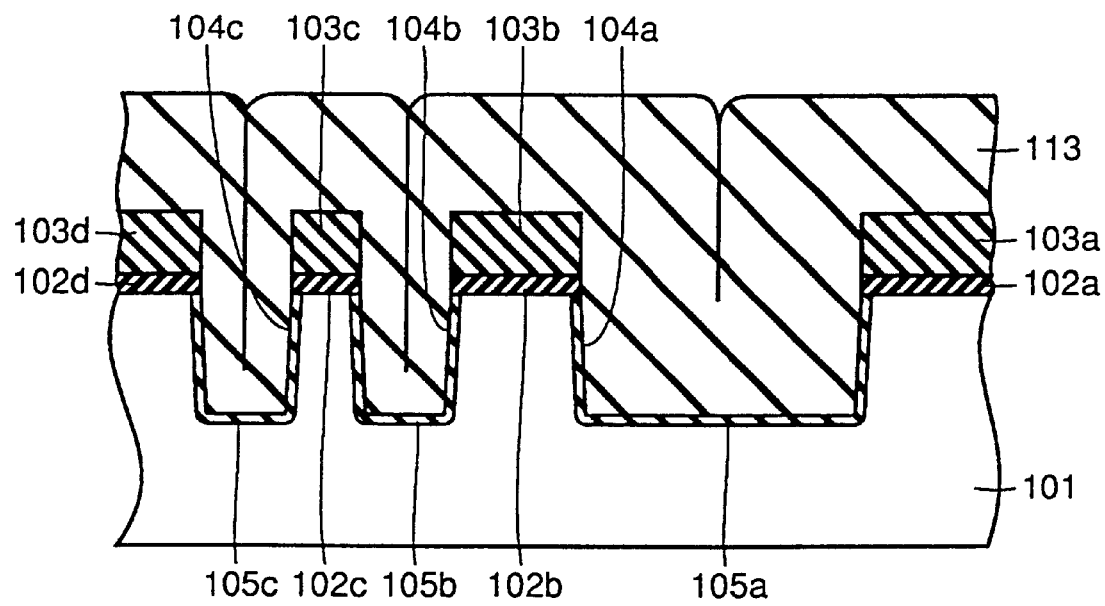
Figure 30:
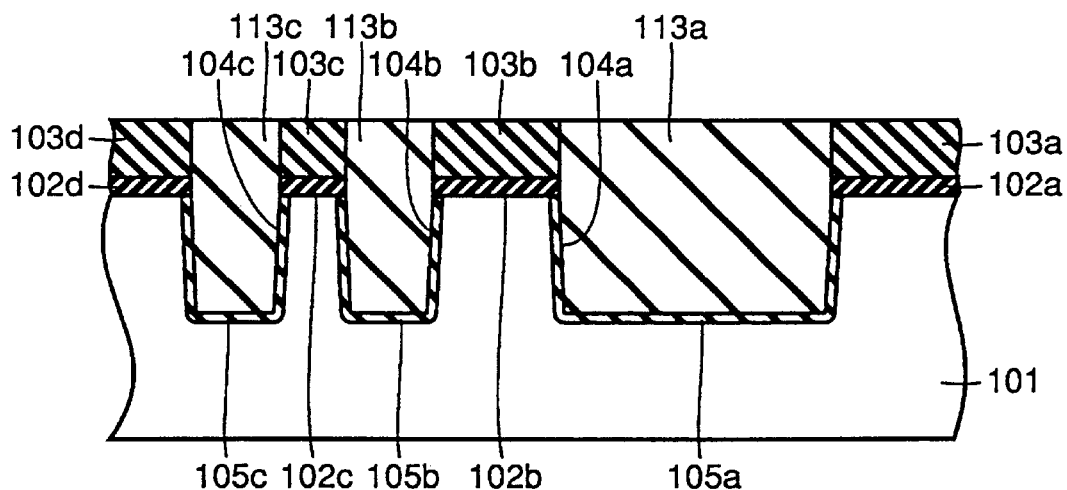
Figure 31:
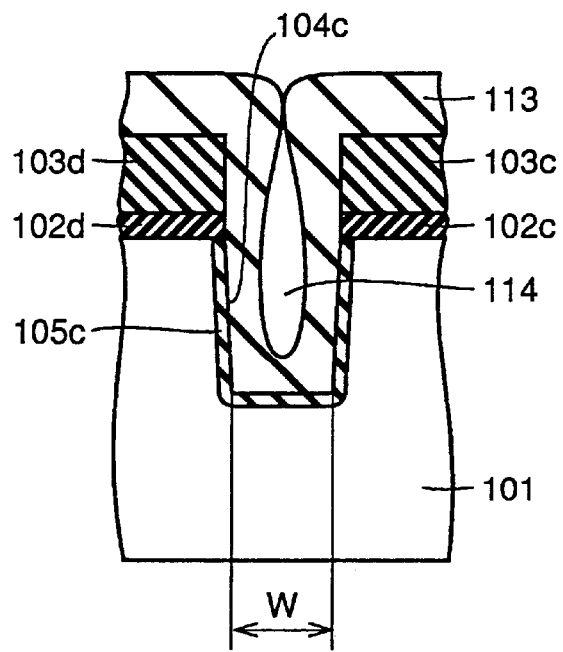
FIG. 31 is a sectional view for illustrating a void formed in a trench in the step shown in FIG. 29.
Figure 32:
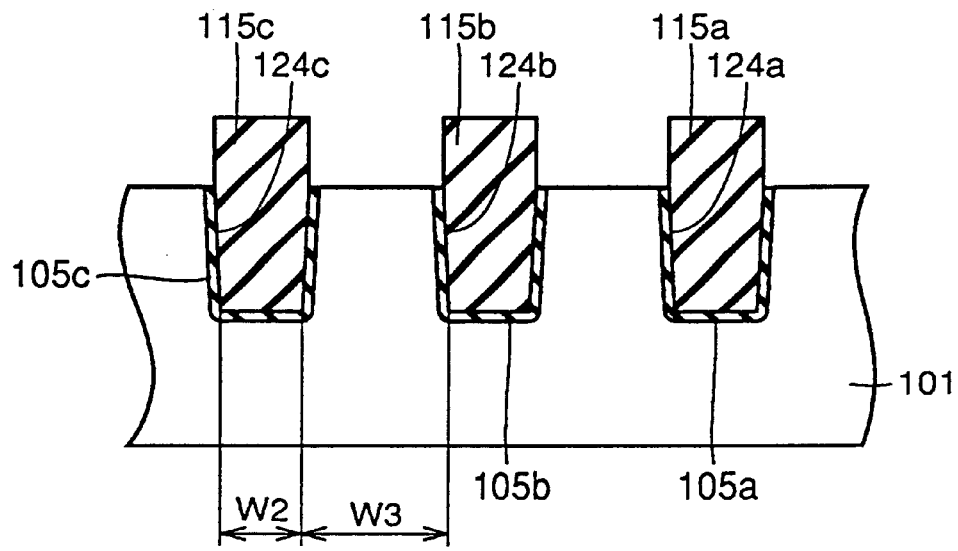
FIG. 32 is a sectional view for illustrating trench isolation oxide films formed by HDP-CVD.
Figure 33:
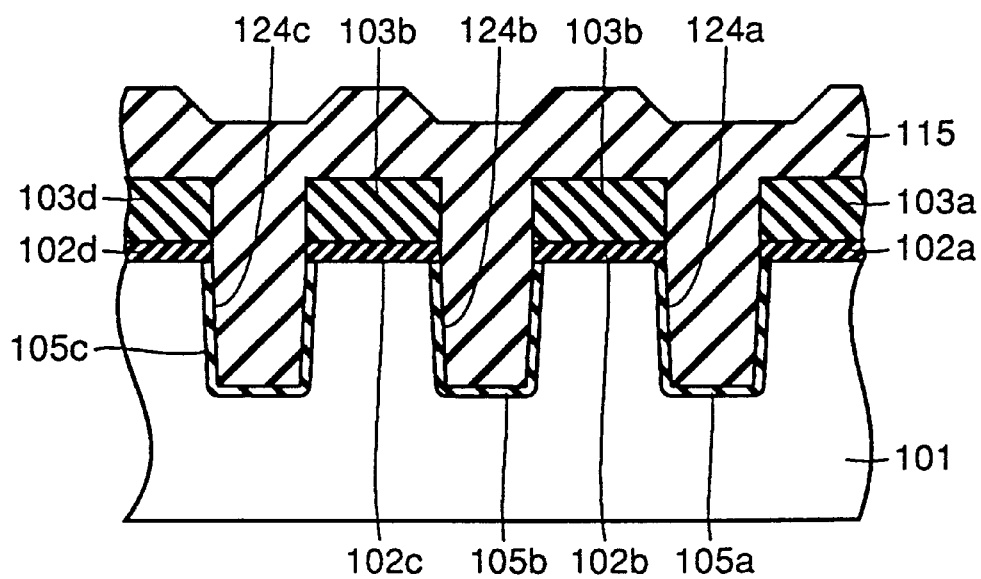
FIG. 33 is a sectional view for illustrating a method of forming the trench isolation oxide films shown in FIG. 32 by HDP-CVD.
Figure 34:
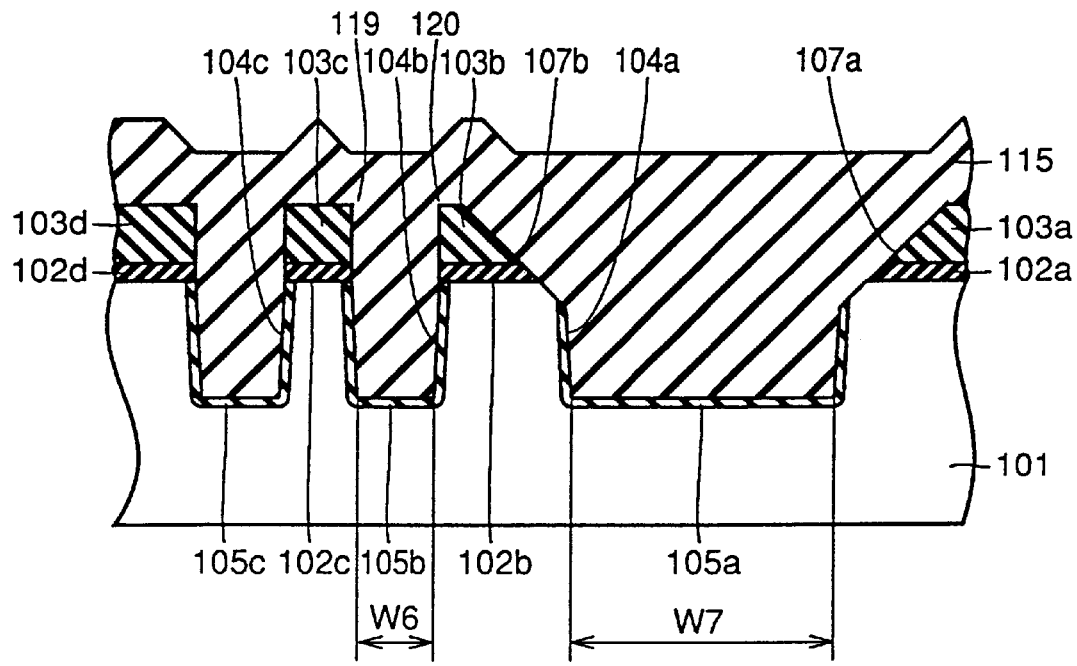
FIGS. 34 to 36 are sectional views for illustrating first to third steps of forming trench isolation oxide films carried out by the inventors.
Figure 35:
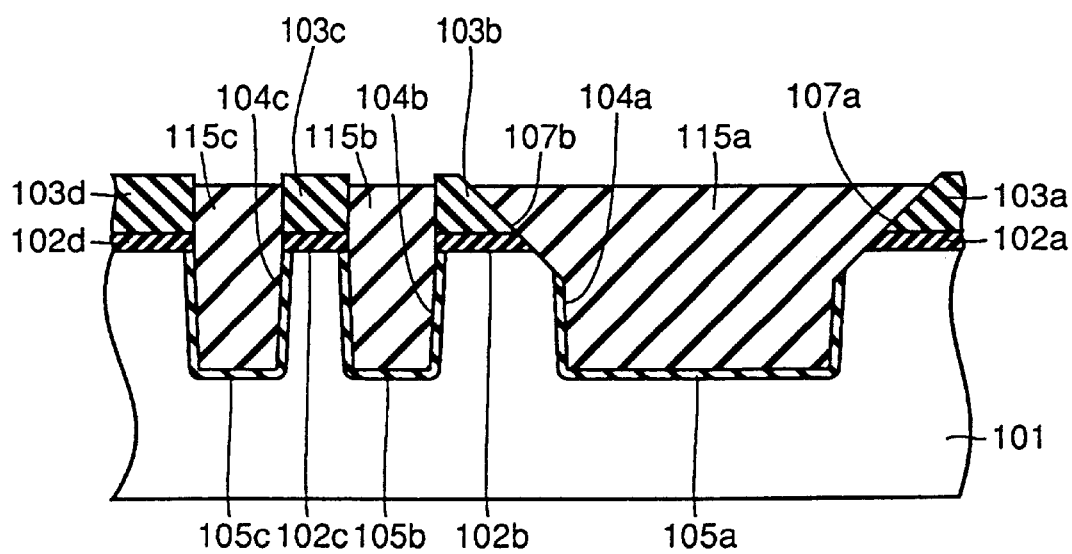
Figure 36:
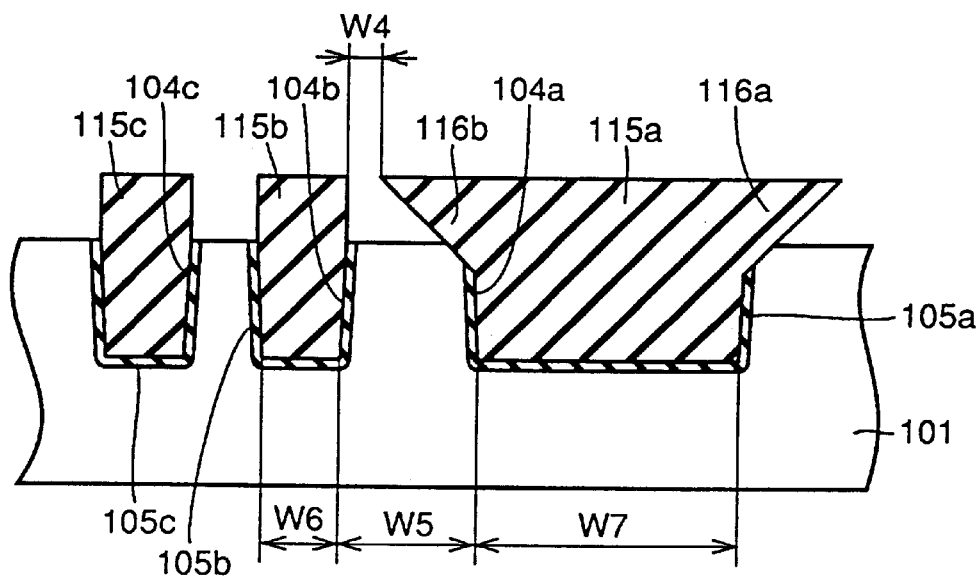
Figure 37:
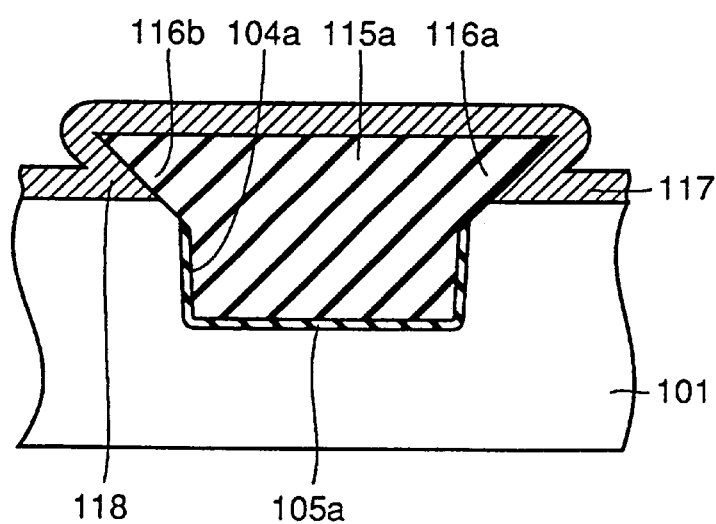
FIG. 37 is a model diagram for illustrating a wire formed on a trench isolation oxide film.

Then, portions of the silicon oxide film 6 located on the silicon nitride films 3*a* to 3*d* are removed by etching or chemical mechanical polishing, thereby obtaining a structure shown in FIG. 25.

Due to the formation of the oxi-nitride films 10*a* to 10*c* on the silicon nitride films 3*a* to 3*d*, an effect similar to that in the steps of forming the trench isolation oxide films in the method of fabricating the semiconductor device according to the embodiment 4 shown in FIGS. 14 and 15 can be attained.

Then, the silicon nitride films 3*a* to 3*d* and thermal oxide films 2*a* to 2*d* are removed from a major surface of a semiconductor substrate 1, whereby the structure shown in FIG. 21 can be obtained.

In each of the aforementioned embodiments 1 to 6, the semiconductor substrate 1 may be formed by a p-type silicon substrate or an n-type silicon substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device, comprising the steps of:
   forming a covering film on a major surface of a semiconductor substrate;
   selectively removing said covering film thereby exposing said major surface of said semiconductor substrate in an element isolation region;
   partially removing said semiconductor substrate using said covering film as a mask thereby forming a first trench and a second trench having a width narrower than the width of said first trench, wherein the first and second trenches each have side surfaces;
   forming a side wall insulator film on said side surface of said first trench but not on said side surface of said second trench;
   forming an insulator film for defining internal insulator films on said side wall insulator film, filling said first trench, on said side surface filling said second trench and on said covering film;
   removing a portion of said insulator film located on said covering film; and
   removing said covering film.

2. A method of fabricating a semiconductor device, comprising steps of:
   forming a covering film on a major surface of a semiconductor substrate; selectively removing said covering film thereby exposing said major surface of said semiconductor substrate in an element isolation region;
   partially removing said semiconductor substrate through said covering film serving as a mask thereby forming a first trench and a second trench having a width narrower than that of said first trench;
   forming a side wall insulator film on at least a side surface of said first trench;
   forming an insulator film for defining internal insulator films on said side wall insulator film, in said first and second trenches and on said covering film;
   removing a portion of said insulator film located on said covering film; and
   removing said covering film, wherein
   said step of forming said side wall insulator film on at least said side surface of said first trench includes steps of:
      forming an insulator film for defining said side wall insulator film in said first and second trenches and on said covering film,
      forming a protective film on said insulator film in a region located on said first trench,
      removing said insulator film from said second trench through said protective film serving as a mask, and
      removing said protective film.

3. The method of fabricating a semiconductor device in accordance with claim 2, wherein
   a deposition method simultaneously progressing deposition and removal of said insulator film is employed in said step of forming said insulator film for defining said internal insulator films on said side wall insulator film, in said first and second trenches and on said covering film.

4. The method of fabricating a semiconductor device in accordance with claim 2, wherein
   said protective film is prepared from a resist.

5. A method of fabricating a semiconductor device, comprising steps of:
   forming a covering film on a major surface of a semiconductor substrate; selectively removing said covering film thereby exposing said major surface of said semiconductor substrate in an element isolation region;
   partially removing said semiconductor substrate through said covering film serving as a mask thereby forming a first trench and a second trench having a width narrower than that of said first trench;
   forming a side wall insulator film on at least a side surface of said first trench;
   forming an insulator film for defining internal insulator films on said side wall insulator film, in said first and second trenches and on said covering film;
   removing a portion of said insulator film located on said covering film; and
   removing said covering film, wherein
   said step of forming said side wall insulator film on at least said side surface of said first trench includes steps of:
      forming an insulator film for defining said side wall insulator film in said first and second trenches and on said covering film so that the thickness in said first trench is larger than half the width of said second trench, and
      removing a first part of said insulator film by isotropic etching for leaving a second past of said insulator film on at least said side surface of said first trench thereby forming said side wall insulator film.

6. The method of fabricating a semiconductor device in accordance with claim 5, wherein said insulator film is left on said covering film in said step of removing said first part of said insulator film by isotropic etching for leaving said second part of said insulator film on at least said side surface of said first trench thereby forming said side wall insulator film.

7. The method of fabricating a semiconductor device in accordance with claim 2, wherein said side wall insulator film is made of a material having a thermal expansion coefficient being substantially identical to that of said semiconductor substrate.

8. The method of fabricating a semiconductor device in accordance with claim 5, wherein a deposition method simultaneously progressing deposition and removal of said insulator film is employed in said step of forming said insulator film for defining said internal insulator films on said side wall insulator film, in said first and second trenches and on said covering film.

9. The method of fabricating a semiconductor device in accordance with claim 5, wherein:

said side wall insulator film is made of a material having a thermal expansion coefficient being substantially identical to that of said semiconductor substrate; and the underlying insulator film includes oxide film.

* * * * *